(12) United States Patent
Nishino et al.

(10) Patent No.: US 6,437,414 B1
(45) Date of Patent: Aug. 20, 2002

(54) OPTICAL SEMICONDUCTOR DEVICE AND METHOD FOR FABRICATING THE SAME

(75) Inventors: Hironori Nishino; Yusuke Matsukura; Hitoshi Tanaka; Mitsunori Yokoyama, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 23 days.

(21) Appl. No.: 09/604,069

(22) Filed: Jun. 26, 2000

(30) Foreign Application Priority Data

Jul. 30, 1999 (JP) .......................................... 11-217339

(51) Int. Cl.$^7$ .............................................. H01L 31/00
(52) U.S. Cl. ...................... 257/440; 257/448; 257/459
(58) Field of Search .......................... 257/21, 184, 431, 257/432, 440, 443, 459, 448

(56) References Cited

U.S. PATENT DOCUMENTS

| 4,894,526 A | 1/1990 | Bethea et al. ............... 250/211 |
| 5,023,685 A | 6/1991 | Bethea et al. .................. 357/30 |
| 5,223,704 A | * 6/1993 | Hui et al. |
| 5,318,666 A | * 6/1994 | Elkind et al. |
| 5,506,419 A | 4/1996 | Levine et al. .................. 257/17 |
| 5,532,173 A | * 7/1996 | Martin et al. |
| 6,184,538 B1 | * 2/2000 | Bandara et al. |

FOREIGN PATENT DOCUMENTS

| JP | 63-246626 | 10/1963 |
| JP | 2-43777 | 2/1990 |

* cited by examiner

*Primary Examiner*—Nathan Flynn
*Assistant Examiner*—Kevin Quinto
(74) *Attorney, Agent, or Firm*—Armstrong, Westerman & Hattori, LLP

(57) ABSTRACT

The optical semiconductor device comprises a first contact layer 28 formed on a substrate 16; a first quantum well layer 34 formed on the first contact layer; a second contact layer 36 formed on the first quantum well layer; an optical coupling layer 44 formed on the second contact layer; and a first conductor plug 50 extended from an upper surface of the optical coupling layer and arriving at the first contact layer.

13 Claims, 19 Drawing Sheets

OPTICAL SEMICONDUCTOR DEVICE AND METHOD FOR FABRICATING THE SAME

BACKGROUND OF THE INVENTION

The present invention relates to an optical semiconductor device and a method for fabricating the optical semiconductor device, more specifically, an optical semiconductor device having the detection sensitivity increased and a method for fabricating the optical semiconductor device.

Infrared sensors of the quantum well type which are applicable to detection of two wavelengths of infrared radiation.

The conventional infrared sensor, i.e., the conventional optical semiconductor device will be explained with reference to FIGS. 19A and 19B. FIG. 19B is a plan view of one picture element of the conventional optical semiconductor device, which is on the side of the substrate of the sensor device. FIG. 19A is a sectional view along the line A–A' in FIG. 19B.

As shown in FIG. 19A, on the side of the substrate 116, which is on the side of the sensor device substrate a picture element isolation insulation layer 118 is formed. A contact layer 120 is formed on the picture element isolation insulation layer 118. An MQW (Multi Quantum Well) layer 126 is formed on the contact layer 120. A contact layer 128 is formed on the MQW layer 126.

On the contact layer 128, an MQW layer 134 having different light absorbing characteristics from the MQW layer 126 is formed. A contact layer 136 is formed on the MQW layer 134.

An insulation film 140 is formed on the contact layer 136. An optical coupling layer 144 is formed in stripes on the insulation film 140.

A mirror electrode 164 is formed on the upper surface and the side surface of the optical coupling layer 144 formed in stripes. The mirror electrode 164 and the optical coupling layer 144 make up an optical coupler. Light incident on the side of the substrate 116 is scattered by the optical coupler to be absorbed by the MQW layers 126, 134.

In such optical semiconductor device, an opening 200 and an opening 202 are formed from the upper surface of the mirror electrode 164 respectively down to the contact layer 120 and the contact layer 128. The openings 200, 202 are diverged gradually from the contact layers 120, 128 to the mirror layer 164. A picture element isolation groove 166 for isolating each picture element is formed down to the picture element isolation insulation film 118. An insulation film 168 is formed on the entire surface.

Contact holes are further formed in the bottoms of the openings 200, 202, arriving at the contact layers 120, 128. Ohmic electrodes 162c, 162a are formed respectively on the contact layers 120, 128 in the contact holes.

As shown in FIG. 19B, three connection electrodes 114a, 114b, 114c are formed in a cylindrical shape outside the openings 200, 202. The connection electrodes 114a, 114b, 114c are to be connected to a reading circuit substrate (not shown) for reading detected signals.

The connection electrode 114a is connected by a line 206 to the ohmic electrode 162a formed on the contact layer 128. The connection electrode 114c is connected by a line 204 to the ohmic electrode 162c formed on the contact layer 120. The connection electrode 114b is connected to an ohmic electrode 162b formed on the contact layer 136.

The mirror electrode 164 is formed on the entire surface, interrupted around the connection electrodes 114a, 114b, 114c for the prevention of short-circuit among the connection electrodes 114a, 114b, 114c.

In such optical semiconductor device, a direct-current bias is applied from the side of the reading circuit substrate via the connection electrode 114a. An output of the MQW layer 134 is supplied to the reading circuit substrate via the connection electrode 114b. An output of the MQW layer 126 is supplied to the reading circuit substrate via the connection electrode 114c.

However, in the conventional optical semiconductor device, the openings 200, 202 are formed large, and especially the opening 200 arriving at the lower MQW layer 126 is made larger, which makes an area of the optical coupler and an area of the MQW layers 126, 134 accordingly small. That is, a light-receptive area of the optical semiconductor device of such structure is too small to obtain sufficient sensitivity.

SUMMARY OF THE INVENTION

An object of the present invention is to provide an optical semiconductor device having improved optical detection sensitivity and a method for fabricating the optical semiconductor device.

The above-described object is achieved by an optical semiconductor device comprising: a first contact layer formed on a substrate; a first quantum well layer formed on the first contact layer; a second contact layer formed on the first quantum well layer; an optical coupling layer formed on the second contact layer; and a first conductor plug extended from an upper surface of the optical coupling layer and arriving at the first contact layer. The contact layers and the connection electrodes are connected to each other respectively by the conductor plugs. The conductor plugs have such small sectional areas that the quantum well layers can secure sufficiently large areas. Accordingly, high sensitivity can be provided. Upper portions of the conductor plugs are also etched in stripes, and can function as an optical coupler, whereby light can be scattered, with a result of increased sensitivity. The conductor plugs are buried in the contact holes, whereby the connection electrodes can be formed on the conductor plugs. Accordingly, higher freedom of design can be obtained in arranging the connection electrodes.

DETAILED DESCRIPTION OF THE INVENTION

Figure 1A:
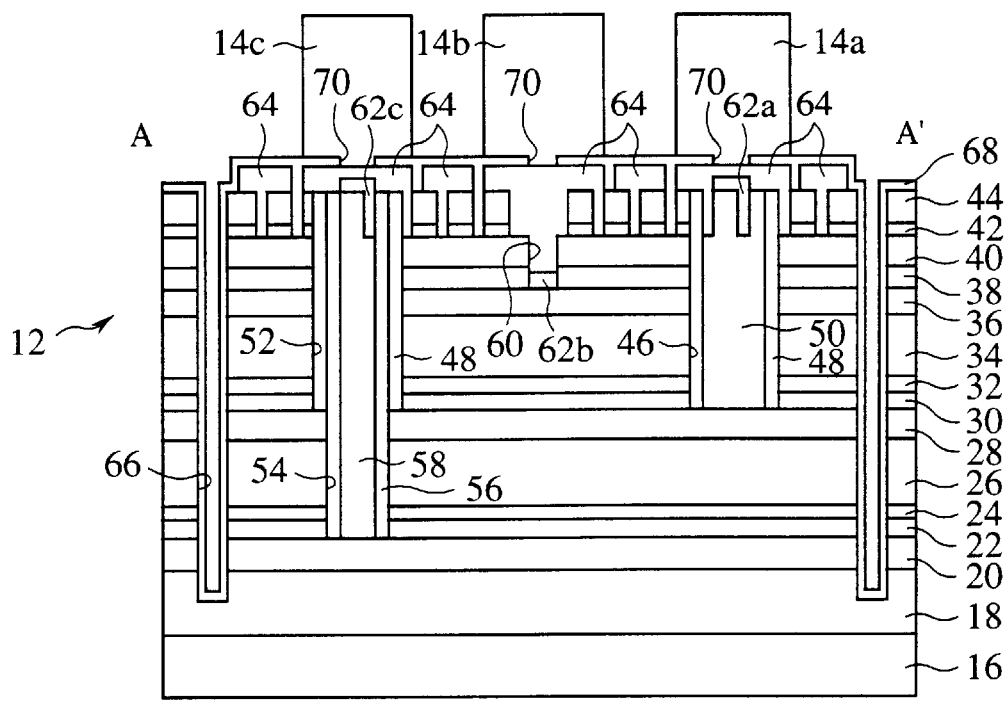
FIG. 1A is sectional view of the optical semiconductor device according to one embodiment of the present invention, which shows one picture element of the sensor element substrate.
Figure 1B:
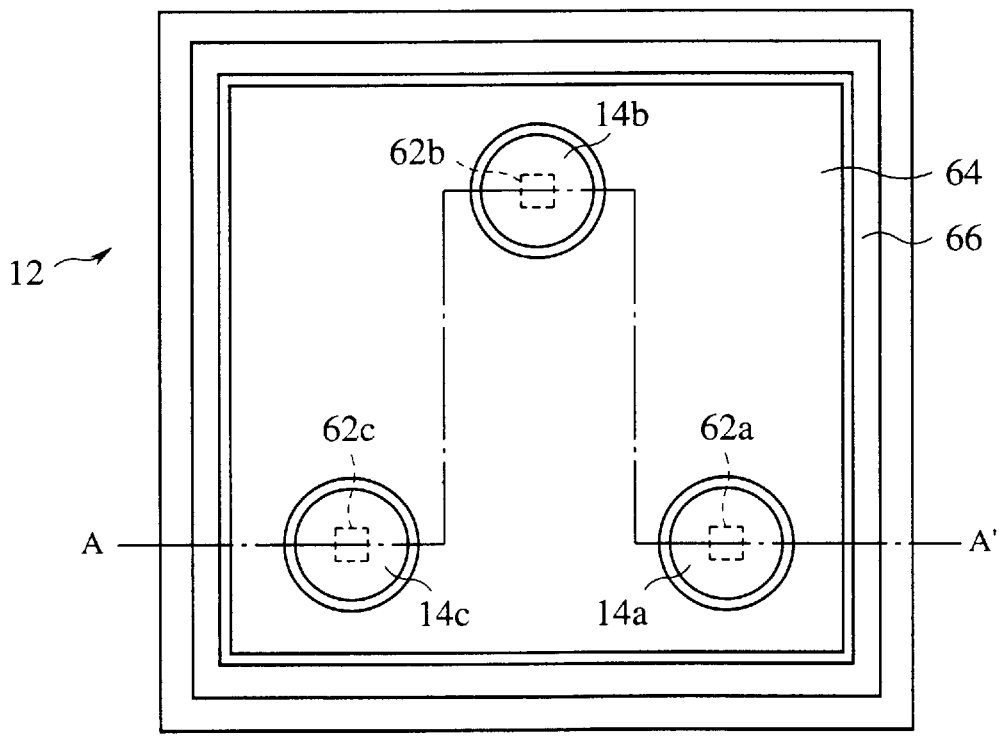
FIG. 1B is a plane view of the optical semiconductor device according to the embodiment of the present invention, which shows one picture element of the sensor element substrate.
Figure 2:
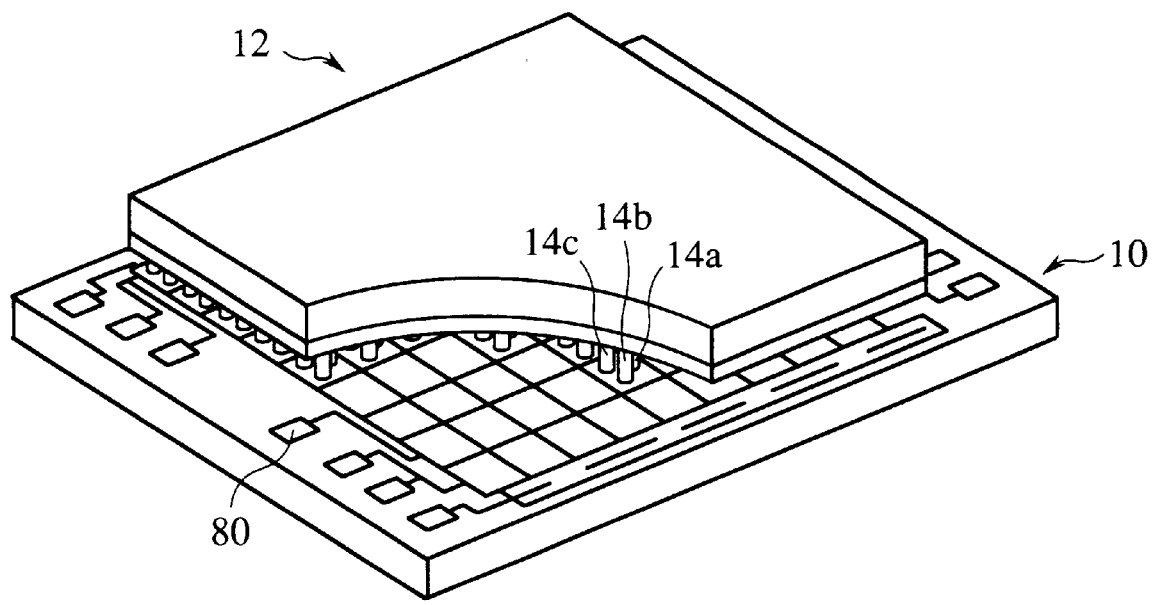
FIG. 2 is a perspective view of the optical semiconductor device according to the embodiment of the present invention.
Figure 3:
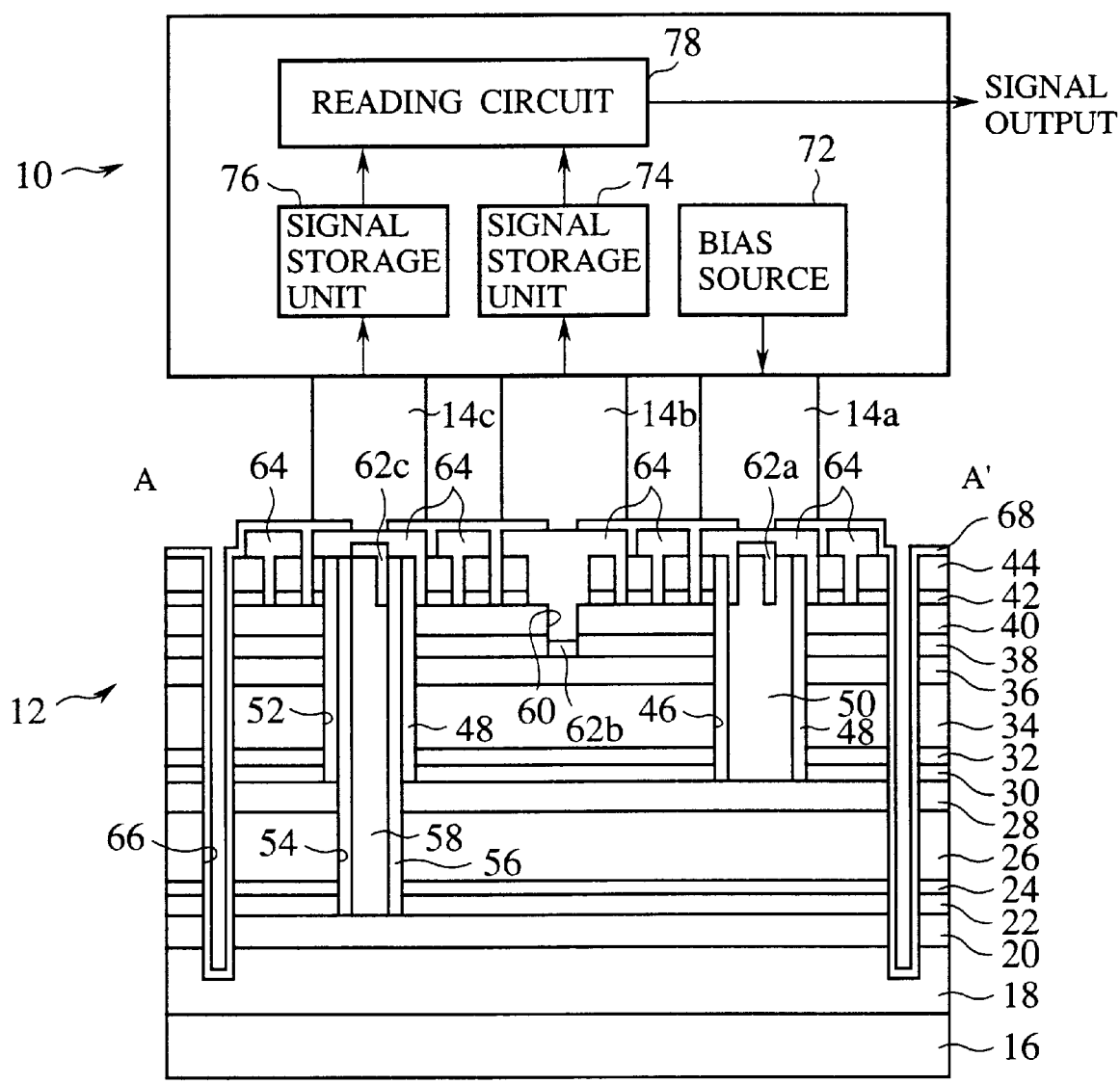
FIG. 3 is a conceptual view of a connection state between the sensor element substrate and a signal reading substrate.

The optical semiconductor device according to one embodiment of the present invention will be explained with reference to FIGS. 1A to 17. FIG. 1A is a sectional view of the optical semiconductor device according to the present embodiment, which shows one picture element of the sensor element substrate. FIG. 1B is a plane view of the optical semiconductor device according to the present embodiment, which shows one picture element of the sensor element substrate. FIG. 1A is a sectional view along the line A–A' in FIG. 1B. FIG. 2 is a perspective view of the optical semiconductor device according to the present embodiment. FIG. 3 is a conceptual view of a connection between the sensor element substrate and a signal reading circuit substrate. FIGS. 4A to 17 are sectional views of the optical semiconductor device according to the present embodiment in the steps of the method for fabricating the same, which show the fabrication method.

As shown in FIG. 2, the optical semiconductor device according to the present embodiment has a structure that the sensor element substrate 12 is mounted on the signal reading circuit substrate 10. Three connection electrodes 14a, 14b, 14c are provided for each picture element on the sensor element substrate 12. The connection electrode 14a, 14b, 14c are formed in a cylindrical shape. The connection electrodes 14a, 14b, 14c connect the associated picture element to the signal reading circuit substrate 10.

First, the sensor element substrate of the optical semiconductor device according to the present embodiment will be explained with reference to FIGS. 1A and 1B.

As shown in FIG. 1A, a picture element isolation insulation layer 18 of a 900 nm-film thickness i-type GaAs layer is formed on a (100) GaAs substrate 16.

A contact layer 20 of a 100 nm-film thickness n-type GaAs layer is formed on the picture element isolation insulation layer 18. The contact layer 20 electrically connects a conductor plug 58 and the lower side of an MQW layer 26 to each other. The conductor plug 58 and the MQW layer 26 will be described later.

A stopper layer 22 of a 30 nm-film thickness InGaP layer is formed on the contact layer 20. The stopper layer 22 functions as an etching stopper in forming a contact hole 54 which arrives at the contact layer 20.

A 50 nm-film thickness n-type GaAs layer 24 is formed on the stopper layer 22.

The MQW layer 26 is formed on the n-type GaAs layer 24. The MQW layer 26 is formed of a 40 nm-film thickness i-type AlGaAs layers and a 4 nm-film thickness n-type GaAs layer alternately laid one on the other by 20 cycles. An Al composition ratio of the i-type AlGaAs layer forming the MQW layer 26 is 0.3.

A contact layer 28 of a 400 nm-film thickness n-type GaAs layer is formed on the MQW layer 26. The contact layer 28 electrically connects a conductor plug 50 which will be described later and the upper side of the MQW layer 26 to each other, and a conductor plug 50 which will be described later and the lower side of the MQW layer 34 to each other.

A stopper layer 30 of a 30 nm-film thickness n-type InGaP layer is formed on the contact layer 28. The stopper layer 30 functions as an etching stopper in forming a contact hole 46 arriving at the contact layer 28.

An 50 nm-film thickness n-type GaAs layer 32 is formed on the stopper layer 30.

A 940 nm-film thickness MQW layer 34 is formed on the n-type GaAs layer 32. The MQW layer 34 is formed of a 40 nm-film thickness i-type AlGaAs layer and a 5 nm-film thickness n-type GaAs layer alternately laid one on the other by 20 cycles. An Al composition ratio of the i-type AlGaAs layer forming the MQW layer 34 is 0.24.

A contact layer 36 of a 300 nm-film thickness n-type GaAs layer is formed on the MQW layer 34. The contact layer 36 connects a connection electrode 14b which will be described later and the upper side of the MQW layer 34 to each other.

A stopper film 38 of a 5 nm-film thickness i-type AlGaAs layer is formed on the contact layer 36. The stopper layer 38 functions as an etching stopper in etching a surface insulation film 40 which will be described later.

A surface insulation layer 40 of a 400 nm-film thickness i-type GaAs layer is formed on the stopper layer 38.

A stopper layer 42 of a 5 nm-film thickness i-type AlGaAs layer is formed on the surface insulation layer 40. The stopper layer 42 functions as an etching stopper in patterning into a stripe shape an optical coupling layer 44 which will be described later.

The optical coupling layer 44 of a 600 nm-film thickness i-type GaAs layer is formed on the stopper layer 42. The optical coupling layer 44 is formed in a 2.8 $\mu$m-width stripe shape. A pitch of the stripes is 3.5 $\mu$m.

A contact hole 46 is formed below a region where the contact electrode 14a is formed, extended from the upper surface of the optical coupling layer 44 and arriving at the contact layer 28. An insulation film 48 of an SiN film is formed on the inside wall of the contact hole 46. A conductor plug 50 extended from the upper surface of the optical coupling layer 44 and arriving at the contact layer 28 is buried in the contact hole 46 with the insulation film 48 thus formed.

A contact hole 52 extended from the upper surface of the optical coupling layer 44 and arriving at the contact layer 28 is formed below a region where the contact electrode 14c is formed. An insulation film 48 of an SiN film is formed on the inside wall of the contact hole 52. Furthermore, a contact hole 54 is extended from the upper surface of the contact layer 28 and arrives at the contact layer 20. An insulation film 56 of an SiN film is formed on the inside wall of the contact hole 52 with the insulation film 48 formed on and on the inside wall of the contact hole 54. A conductor plug 58 extended from the upper surface of the optical coupling layer 44 and arriving at the contact layer 20 is buried in the contact holes 52, 54 with the insulation films 48, 56 formed on the inside walls.

The optical semiconductor device according to the present embodiment is characterized mainly in that the conductor plug 50 is formed, extended from the upper surface of the optical coupling layer 44 and arriving at the contact layer 28, and the conductor plug 58 is formed, extended from the upper surface of the optical coupling layer 44 and arriving at the contact layer 20. In the conventional optical semiconductor device shown in FIGS. 19A and 19B, the openings 200, 202 have areas gradually increased from the contact layers 120, 128 toward the optical coupling layer 144, which decreases the areas of the MQW layers 126, 134, with a result that high sensitivity cannot be provided. In the present embodiment, the conductor plugs 50, 58 connect the contact layers 28, 20 and the connection electrodes 14a, 14c respectively to each other, and the conductor plugs 50, 58 have very small sectional areas. Accordingly, in the present embodiment, the MQW layers 26, 34 can have sufficiently large areas, and high sensitivity can be provided.

Figure 19A:
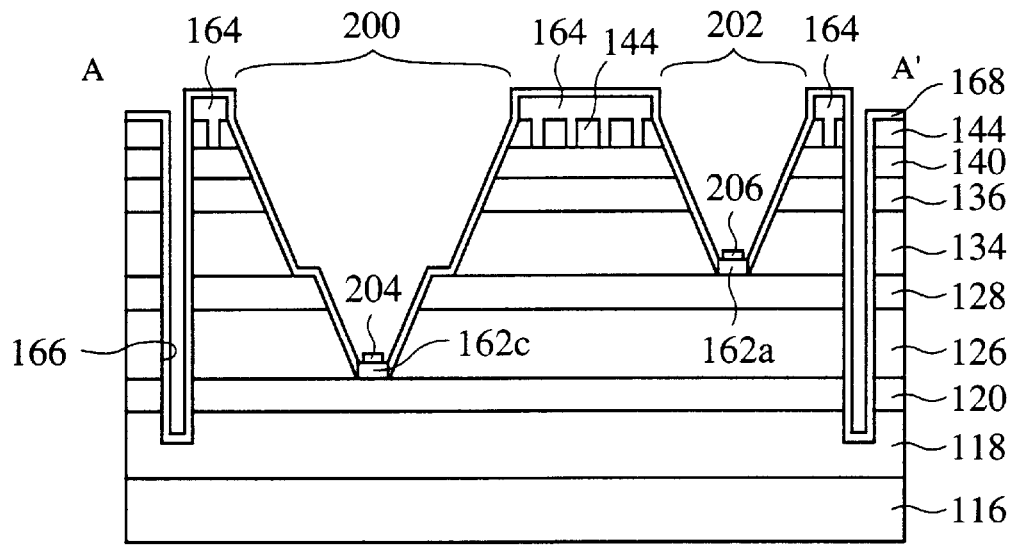
FIG. 19A is a sectional view of the conventional optical semiconductor device.
Figure 19B:
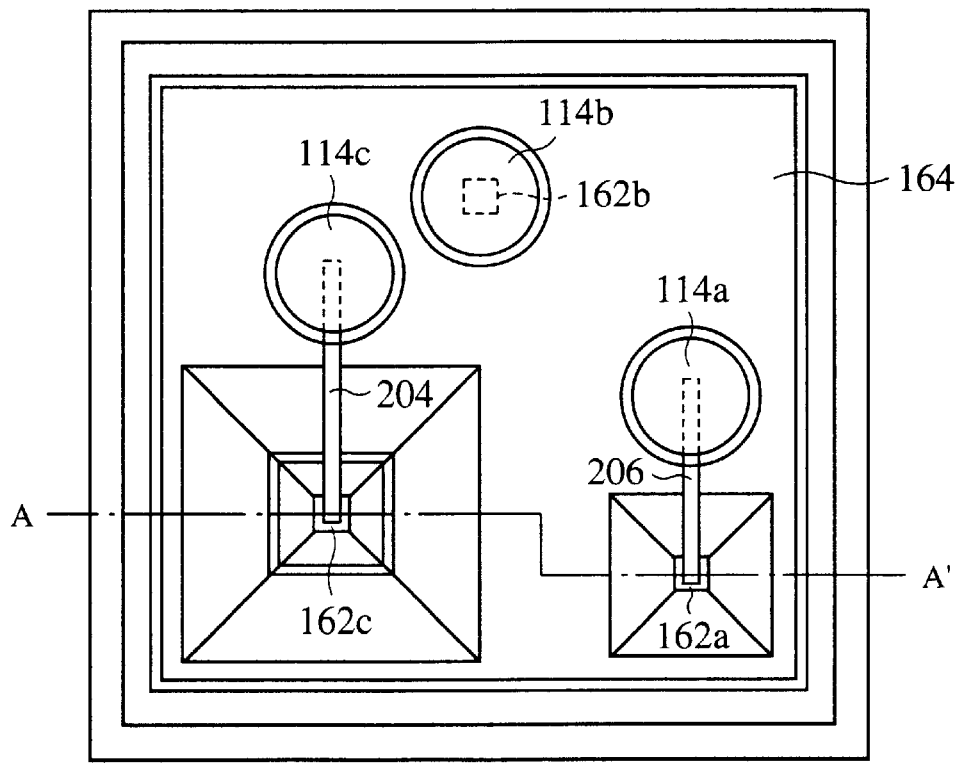
FIG. 19B is a plane view of the conventional optical semiconductor device.

To be specific, when the opening 200 of the conventional optical semiconductor device shown in FIGS. 19A and 19B is 18 $\mu$m, a diameter of the opening 202 is 10 $\mu$m, the conductor plugs 50, 58 of the optical semiconductor device according to the present embodiment are 3 $\mu$m, and one picture element is 40 $\mu$m, the optical semiconductor device according to the present embodiment can increase detection current by about 40% in comparison with the conventional optical semiconductor device.

According to the present invention, because the conductor plugs 50, 58 are buried in the contact holes 46, 52, 54, the connection electrodes 14a, 14c can be formed on the conductor plugs 50, 58. The present embodiment can have accordingly high freedom of design in arranging the connection electrodes 14a, 14c.

Below the region where the connection electrode 14b is to be formed the contact hole 60 is formed, extended from the upper surface of the optical coupling layer 44 and arriving at the contact layer 36. The ohmic electrode 62b is formed on the contact layer 36 in the contact hole 60. The ohmic electrodes 62a, 62c are formed also on the upper surfaces of the conductor plugs 50, 58.

A mirror electrode 64 of a layer film of Au/Ti/Au is formed on the entire surface. The mirror electrode 64 is formed not only on the upper surfaces and the side surfaces of the patterned stripes of optical coupling layer 44 but also on the upper surfaces and the side surfaces of the conductor plugs 50, 58 in the stripe-patterned region. The mirror electrode 64 and the optical coupling layer 44 constitute an optical coupler. Infrared radiation incident on the side of the GaAs substrate 16 is scattered by the optical coupler and absorbed by the MQW layers 26, 34. The conductor plugs 50, 58 in the stripe-patterned region, and the mirror electrode 64 also constitute an optical coupler. According to the present embodiment, the upper portion of the conductor plugs 50, 58, which are etched in stripes as is the optical coupling layer 44, can function as an optical coupler, and can scatter infrared radiation, whereby higher sensitivity can be realized.

The mirror electrode 64 is formed on the substantially entire surface of the sensor element substrate 12, but is suitably isolated for insulation so that the connection electrodes 14a, 14b, 14c are not shorted with each other.

A picture element isolation groove 66 is formed around each picture element on the sensor element substrate 12 for insulating the picture elements adjacent to each other.

An insulation film 68 of a 500 nm-film thickness SiON film is formed on the entire surface. The insulation film 68 is also formed in the picture element isolation groove 66.

Contact holes 70 arriving at the mirror electrode 64 are formed in the insulation film 68 below the regions where the connection electrodes 14a, 14b, 14c are formed. The connection electrodes 14a, 14b, 14c are connected to the mirror electrode 64 through the contact holes 70.

As shown in FIG. 3, such sensor circuit substrate 12 is connected to the signal reading circuit substrate 10 through the connection electrodes 14a, 14b, 14c.

A bias source 72 disposed on the signal reading circuit substrate 10 supplies a bias voltage to the sensor element substrate 12 via the connection electrode 14a. A signal outputted by the MQW layer 34 is supplied to a signal storage unit 74 via the connection electrode 14b.

A signal outputted by the MQW layer 26 is supplied to a signal storage unit 76 of the signal reading circuit substrate 10 via the conductor plug 58 and the connection electrode 14c. The signals stored by the signal storage units 74, 76 are outputted outside by a signal output terminal 80 (see FIG. 2) respectively via a reading circuit 78.

As described above, according to the present embodiment, the contact layers and the connection electrodes are connected to each other by the conductor plugs, and the conductor plugs have very small sectional areas, whereby the MQW layers can secure large areas. Accordingly, high sensitivity can be provided.

According to the present embodiment, the upper portion of the conductor plugs are etched in stripes as is the optical coupling layer, and can function as an optical coupler, whereby infrared radiation can be scattered, and increased sensitivity can be provided.

According to the present embodiment, the conductor plugs are buried in the contact holes, and the connection electrodes can be formed on the conductor plugs. Accordingly, the present embodiment can have higher freedom of design in arranging the connection electrodes.

(Method for Fabricating the Optical Semiconductor Device)

Next, the method for fabricating the optical semiconductor device will be explained with reference to FIGS. 4A to 17.

Figure 4A:
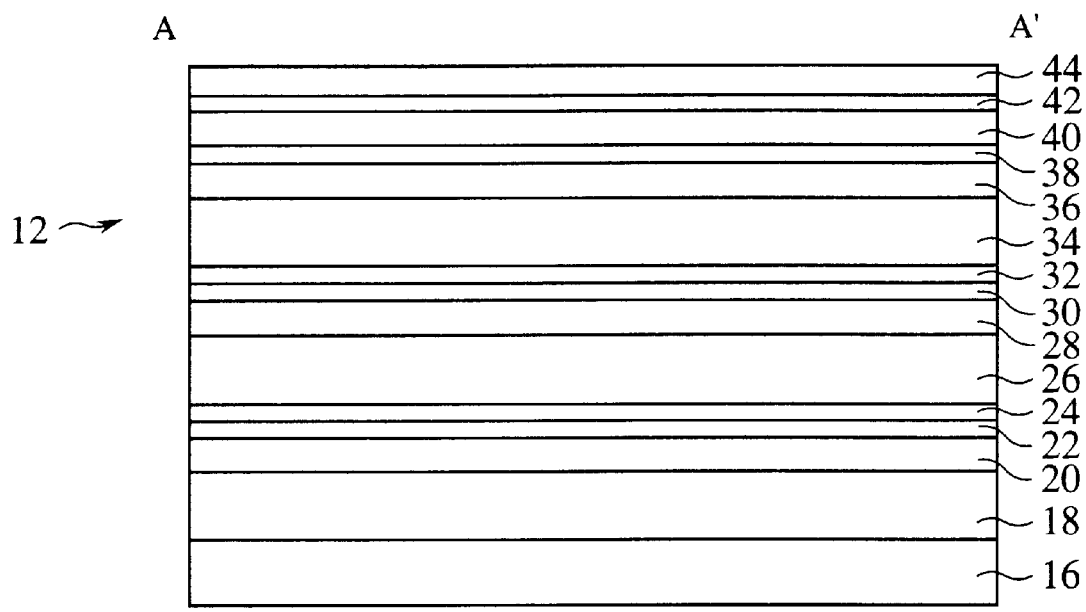
FIGS. 4A and 4B are sectional views of the optical semiconductor device according to the embodiment of the present invention, which show a method for fabricating the optical semiconductor device (Part 1).
Figure 4B:
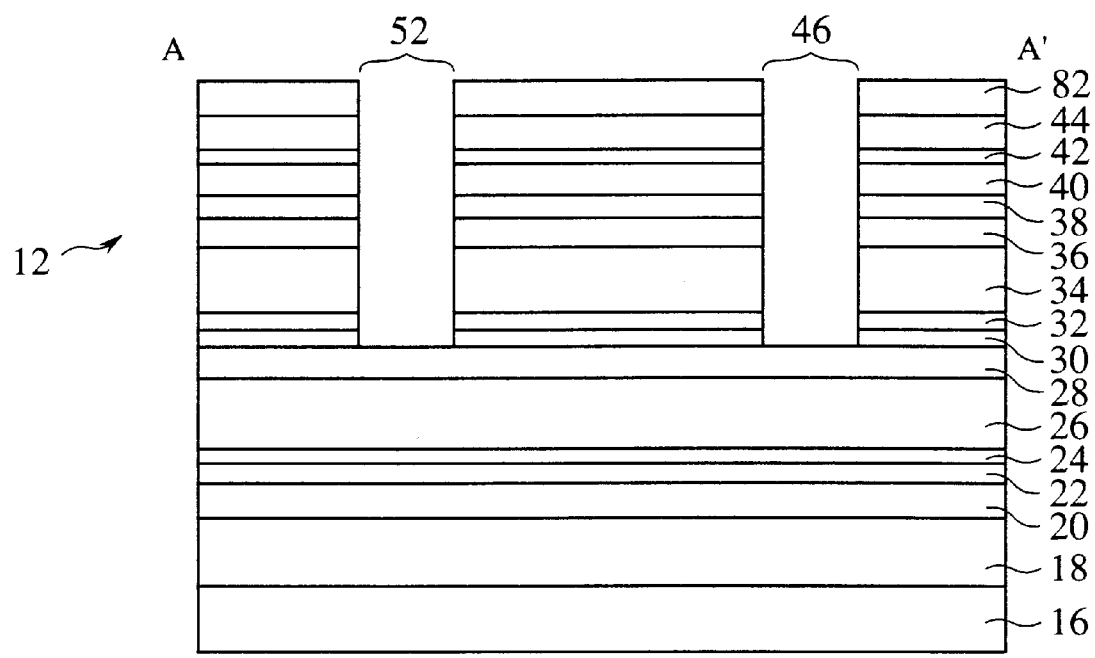
Figure 5A:
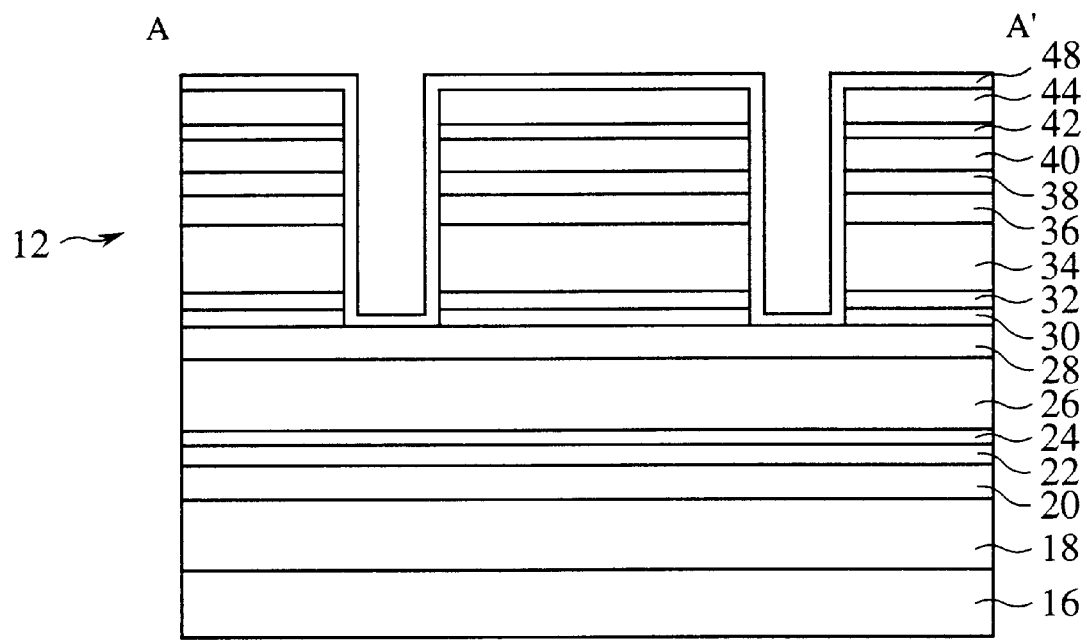
FIGS. 5A and 5B are sectional views of the optical semiconductor device according to the embodiment of the present invention, which show a method for fabricating the optical semiconductor device (Part 2).
Figure 5B:
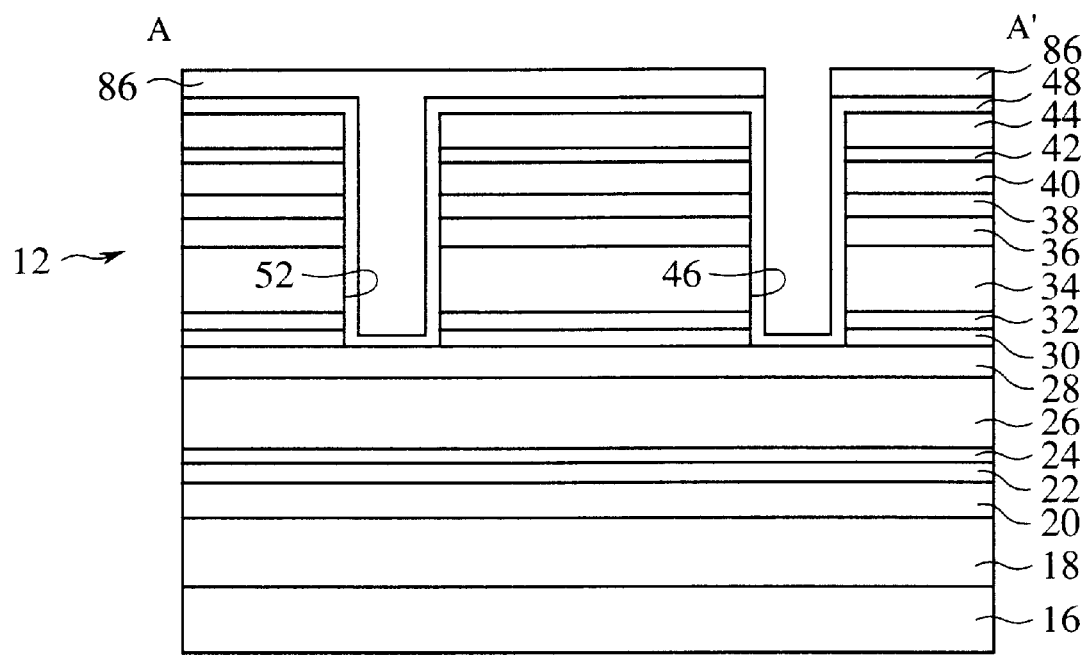

First, a plurality of layers as shown in FIG. 4A are sequentially formed on the GaAs substrate 16 by MOVPE. A material gas for forming these layers can be suitably TEGa (TriEthyl Gallium, $(C_2H_5)_3Ga$), TMIn (TriMethyl Indium, $(CH_3)_3In$), TMAl (TriMethyl Alminum, $(CH_3)_3Al$), $AsH_3$ or $PH_3$. A dopant material can be $SiH_4$.

The picture element isolation insulation film 18 is formed of a 900 nm-film thickness i-type GaAs film on a (100) GaAs substrate 16.

The contact layer 20 is formed of a 100 nm-film thickness n-type GaAs layer on the picture element isolation insulation layer 18. As a dopant impurity, Si, for example, can be used. A concentration of the dopant can be, e.g., $5 \times 10^{17}$ cm$^{-3}$.

Then, the stopper layer 22 is formed of a 30 nm-film thickness n-type InGaP layer on the contact layer 20. As a dopant, Si, for example, can be used. A dopant concentration can be, e.g., $5 \times 10^{17}$ cm$^{-3}$.

Next, a 50 nm-film thickness n-type GaAs layer 24 is formed on the stopper layer 22. As a dopant, Si, for example, can be used. A dopant concentration is, e.g., $5 \times 10^{17}$ cm$^{-3}$.

Then, a 40 nm-film thickness i-type AlGaAs layer and a 4 nm-film thickness n-type GaAs layer are alternately formed by 20 cycles on the n-type GaAs layer 24 to form the MQW layer 26 in a 920 nm-film thickness. An Al composition ratio of the i-type AlGaAs layer forming the MQW layer 26 is, e.g., 0.3. As a dopant to be introduced into the n-type GaAs layer can be, e.g., Si. A dopant concentration is, e.g., $5 \times 10$ cm$^{-3}$.

Next, the contact layer 28 is formed of a 400 nm-film thickness n-type GaAs layer on the MQW layer 26. As a dopant, Si, for example, can be used. A dopant concentration is, e.g., $5 \times 10^{17}$ cm$^{-3}$.

Then, the contact layer 28 is formed of a 400 nm-film thickness n-type GaAs layer on the MQW layer 26. As a dopant, Si, for example, can be used. A dopant concentration is, e.g., $5 \times 10^{17}$ cm$^{-3}$.

Then, the stopper layer 30 is formed of a 30 nm-film thickness n-type InGaP layer on the contact layer 28. As a dopant, Si, for example, can be used. A dopant concentration can be , e.g., $5 \times 10^{17}$ cm$^{-3}$.

Then, a 50 nm-film thickness n-type GaAs layer 32 is formed on the stopper layer 30. As a dopant, Si, for example, can be used. A dopant concentration can be, e.g., $5 \times 10$ cm$^{-3}$.

Next, a 40 nm-film thickness i-type AlGaAs layer and a 5 nm-film thickness n-type GaAs layer are alternately formed by 20 cycles on the n-type GaAs layer to form the MQW layer 34 in a 940 nm-film thickness. An Al composition ratio of the i-type AlGaAs layer is, e.g., 0.24. As a dopant to be introduced into the n-type GaAs layer, Si, for example, can be used. A dopant concentration is, e.g., $5 \times 10^{17}$ cm$^{-3}$.

Then, the contact layer 36 is formed of a 300 nm film thickness n-type GaAs layer on the MQW layer 34. As a dopant, Si, for example, can be used. A dopant concentration is, e.g., $5 \times 10^{17}$ cm$^{-3}$.

Next, the stopper layer 38 is formed of a 5 nm-film thickness i-type AlGaAs layer on the contact layer 36.

Then, a surface insulation layer 40 is formed of a 400 nm-film thickness i-type GaAs layer on the stopper layer 38.

Next, the stopper layer 42 is formed of a 5 nm-film thickness i-type AlGaAs layer on the surface insulation layer 40.

Next, the optical coupling layer 44 is formed of a 600 nm-film thickness i-type GaAs layer on the stopper layer 42.

The respective layer is thus epitaxially grown on the GaAs substrate 16 as shown in FIG. 4A.

Then, a photoresist film (not shown) is formed on the entire surface by spin coating. Then, a pattern in the shape of a process marker is formed on the photoresist film by photolithography. A photoresist mask (not shown) is thus formed.

Then, with the photoresist mask as a mask, wet etching is performed down to a 100 nm depth from the surface of the optical coupling layer 44. As an etching liquid, an etching liquid mixing HF, $H_2O_2$ and $H_2O$ can be used.

Then, the photoresist mask is removed. Thus, the process marker (not shown) is formed on the optical coupling layer 44.

Next, a photoresist film is formed on the entire surface by spin coating. Next, a pattern for forming the contact holes 46, 52 is formed in the photoresist film by photolithography. A photoresist mask 82 is thus formed.

Next, with the photoresist mask 82 as a mask and with the stopper layer 30 as an etching stopper, dry etching is performed. As an etching gas, $SiCl_4$, for example, can be used. The contact holes 46, 52 arriving at the stopper layer 30 is formed by the dry etching.

Then, the stopper layer 28 exposed in the contact holes 46, 52 is etched by wet etching. As an etching liquid, HCl can be used (see FIG. 4B). Then, the photoresist mask 82 is removed.

Then, the insulation film 48 is formed of an 200 nm-film thickness SiN film on the entire surface by plasma CVD. As a raw material gas, $SiH_4$ and $NH_3$ can be used. Thus, the insulation film 48 can be formed also in the contact holes 46, 52 (see FIG. 5A).

Next, a photoresist film is formed on the entire surface by spin coating. Next, a photoresist mask 86 having the region for the contact hole 46 formed in opened is formed by photolithography (see FIG. 5B).

Then, with the photoresist mask 86 as a mask, the insulation film 48 on the bottom of the contact hole 46 is dry etched. As an etching gas, $CHF_3$ and $C_2F_6$ can be used. Then, the photoresist mask 86 is removed.

Figure 6A:
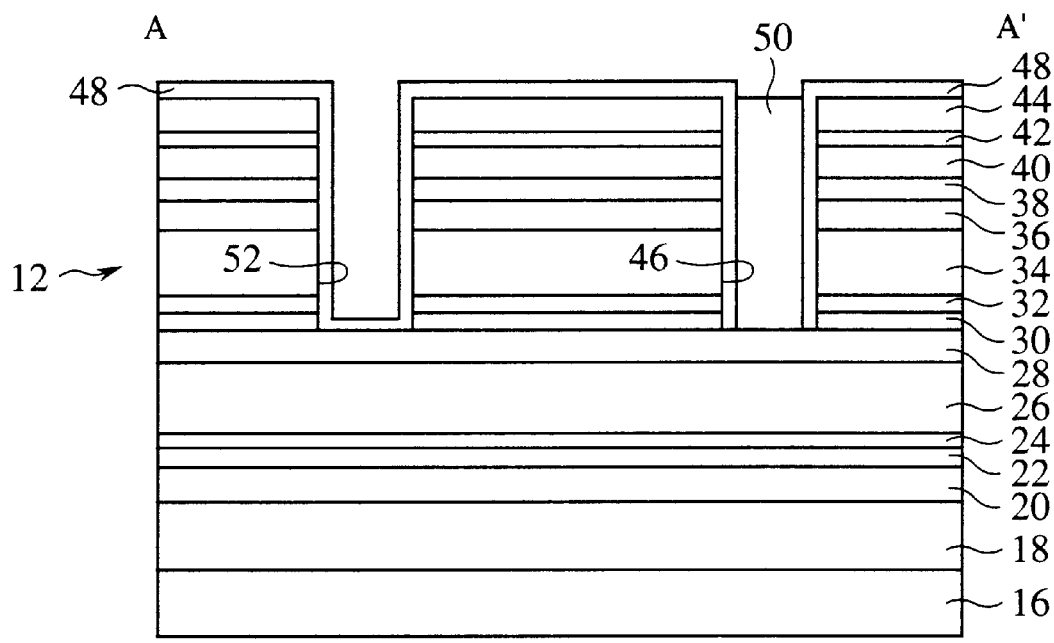
FIGS. 6A and 6B are sectional views of the optical semiconductor device according to the embodiment of the present invention, which show a method for fabricating the optical semiconductor device (Part 3).
Figure 6B:
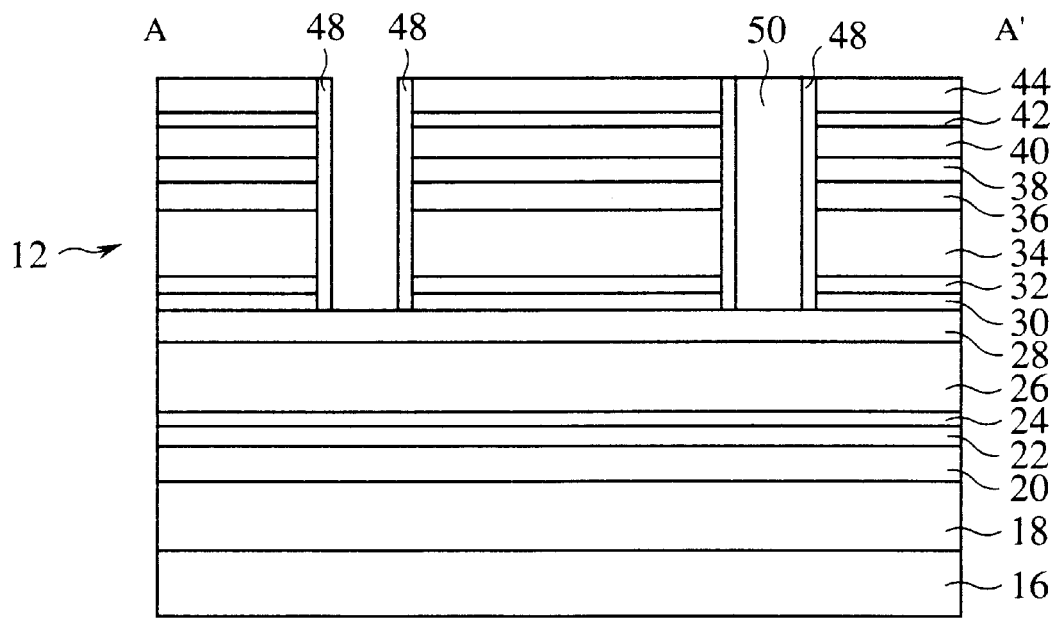
Figure 7A:
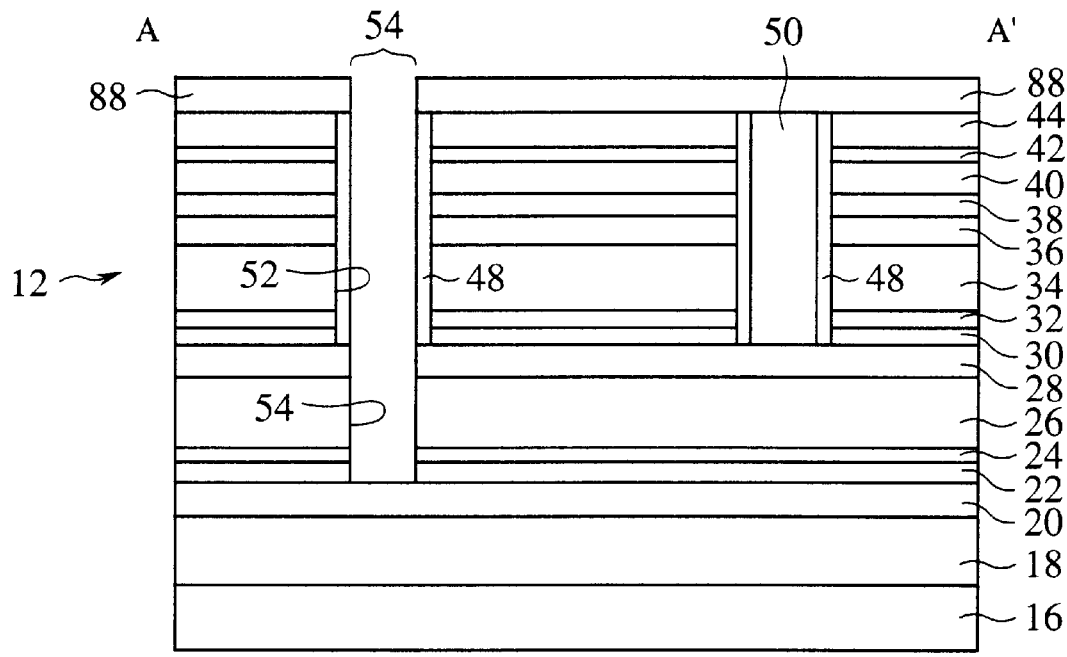
FIGS. 7A and 7B are sectional views of the optical semiconductor device according to the embodiment of the present invention, which show a method for fabricating the optical semiconductor device (Part 4).
Figure 7B:
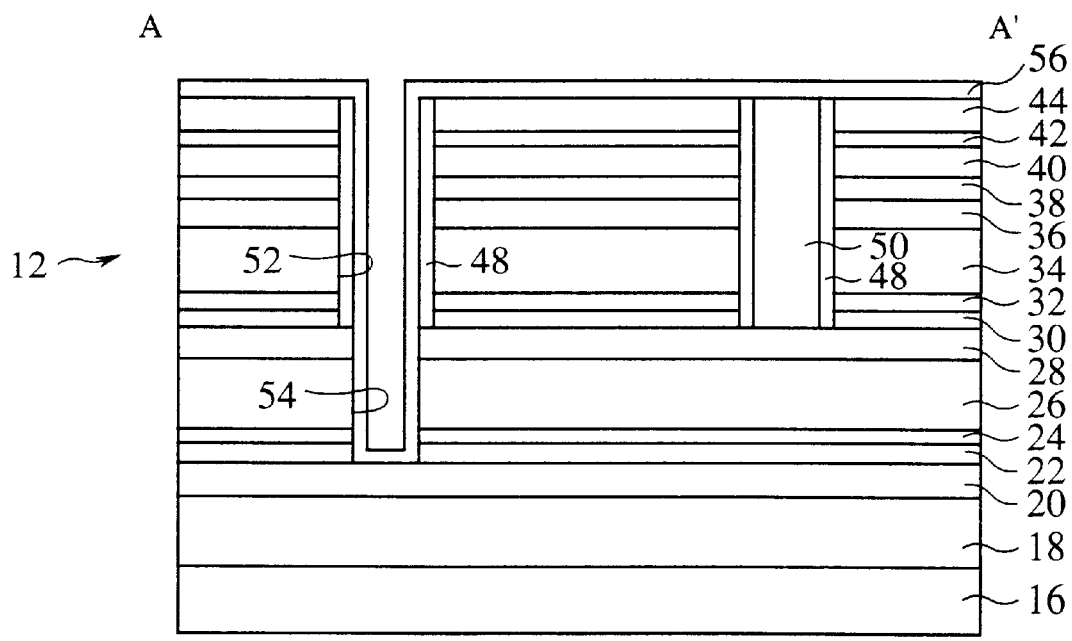

Next, the conductor plug 50 of an n-type GaAs layer is selectively grown in the contact hole 46 by MOVPE (see FIG. 6A).

Then, the insulation film 48 is anisotropically etched. Thus, the insulation film 48 on the optical coupling layer 44 and on the bottom of the contact hole 52 is etched (see FIG. 6B).

Next, a photoresist film is formed on the entire surface by spin coating. Next, a photoresist mask 88 having the region for the contact hole 52 formed in opened is formed by photolithography.

Next, with the photoresist mask 88 as a mask and with the stopper layer 22 as an etching stopper, dry etching is performed. Thus, the contact hole 54 arriving at the stopper layer 22 is formed. As an etching gas, $SiCl_4$, for example, can be used.

Then, the stopper layer 22 exposed in the contact hole 54 is wet etched. As an etching liquid, HCl can be used (see FIG. 7A). Then, the photoresist mask is removed.

Next, the insulation film 56 is formed of a 200 nm-film thickness SiN film by plasma CVD. As a raw material gas, $SiH_4$ and $NH_3$ can be used. Thus, the insulation film 56 is formed also in the contact hole 54 (see FIG. 7B).

Then, a photoresist film is formed on the entire surface by spin coating. Next, a photoresist mask 90 with the region for the contact hole 54 formed in opened is formed by photolithography.

Next, with the photoresist mask 90 as a mask, the insulation film 56 on the bottom of the contact hole 54 is dry etched. As an etching gas, $CHF_3$ and $C_2H_6$ can be used (see FIG. 8A). Then, the photoresist mask is removed.

Figure 8A:
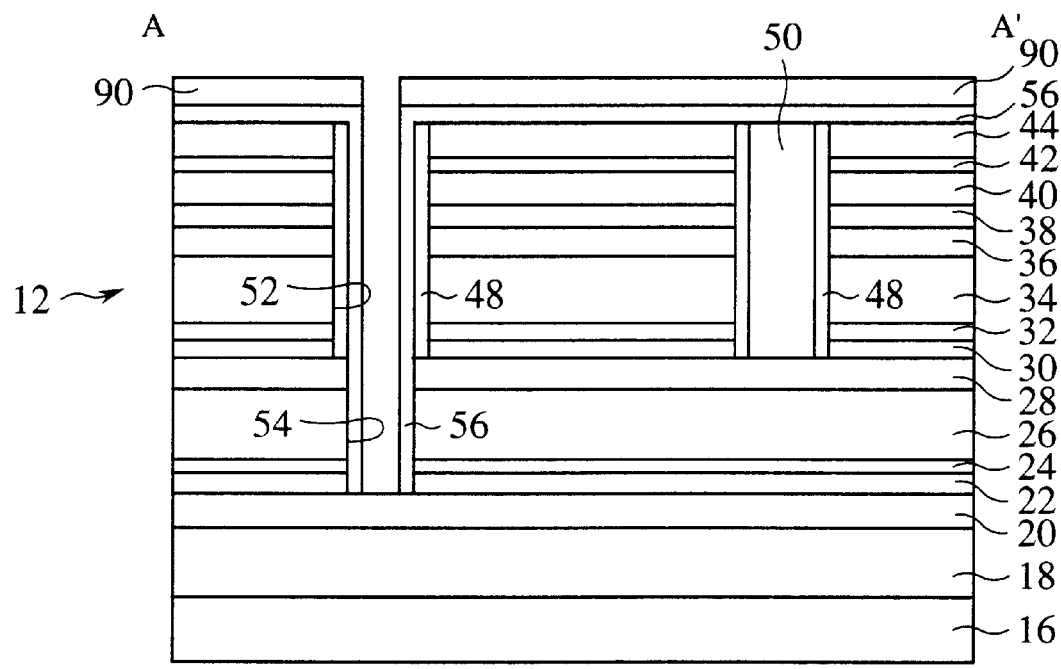
FIGS. 8A and 8B are sectional views of the optical semiconductor device according to the embodiment of the present invention, which show a method for fabricating the optical semiconductor device (Part 5).
Figure 8B:
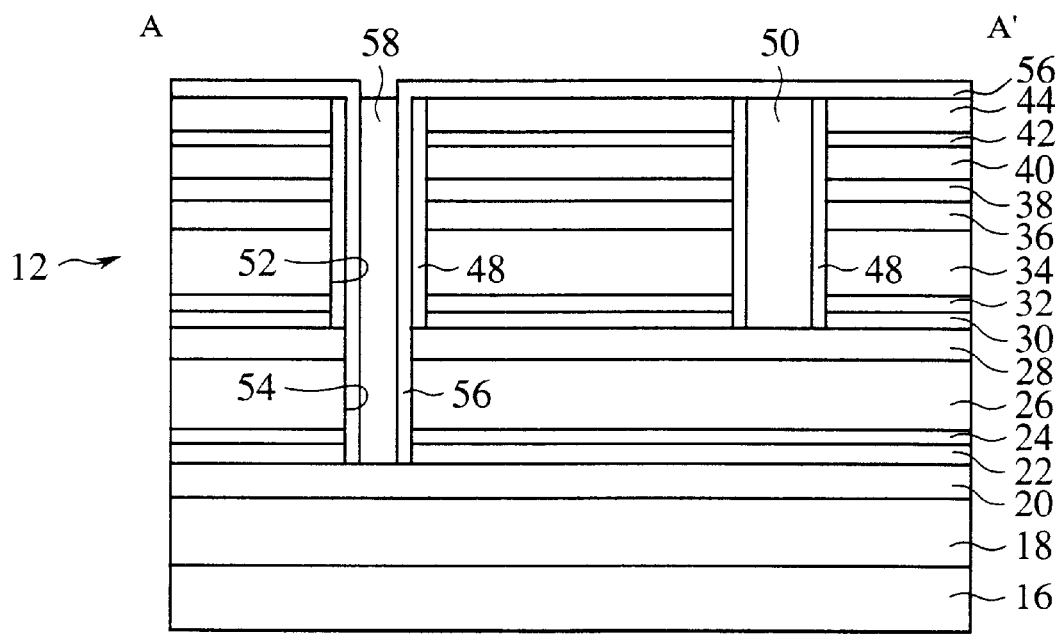

Then, the conductor plug 58 of an n-type GaAs layer is selectively grown by MOVPE in the contact holes 52, 54 with the insulation films 48, 56 formed in (see FIG. 8B).

Figure 9A:
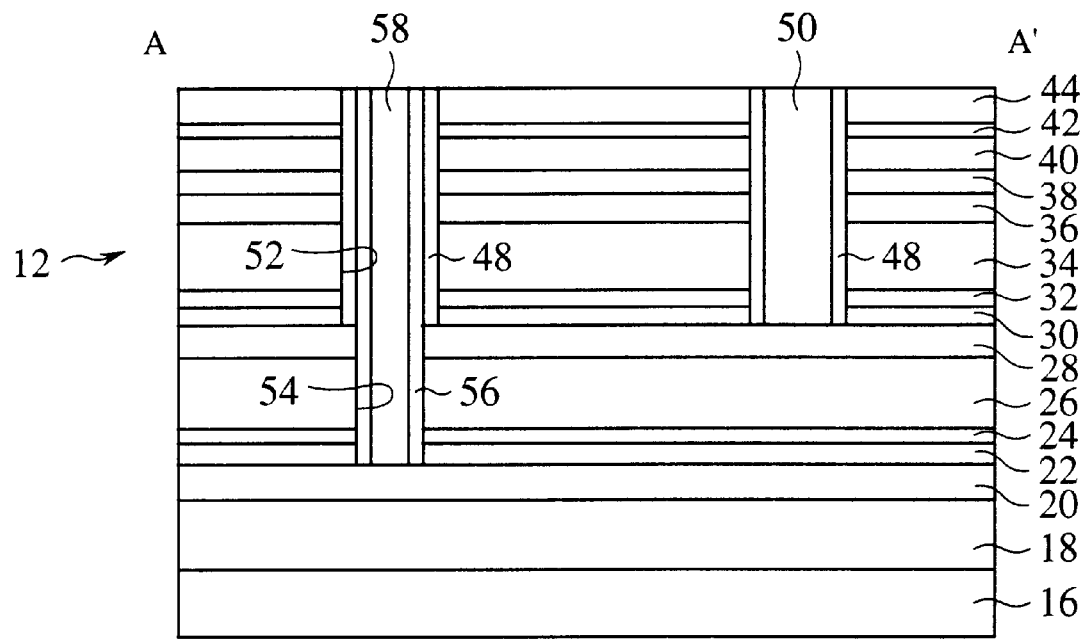
FIGS. 9A and 9B are sectional views of the optical semiconductor device according to the embodiment of the present invention, which show a method for fabricating the optical semiconductor device (Part 6).
Figure 9B:
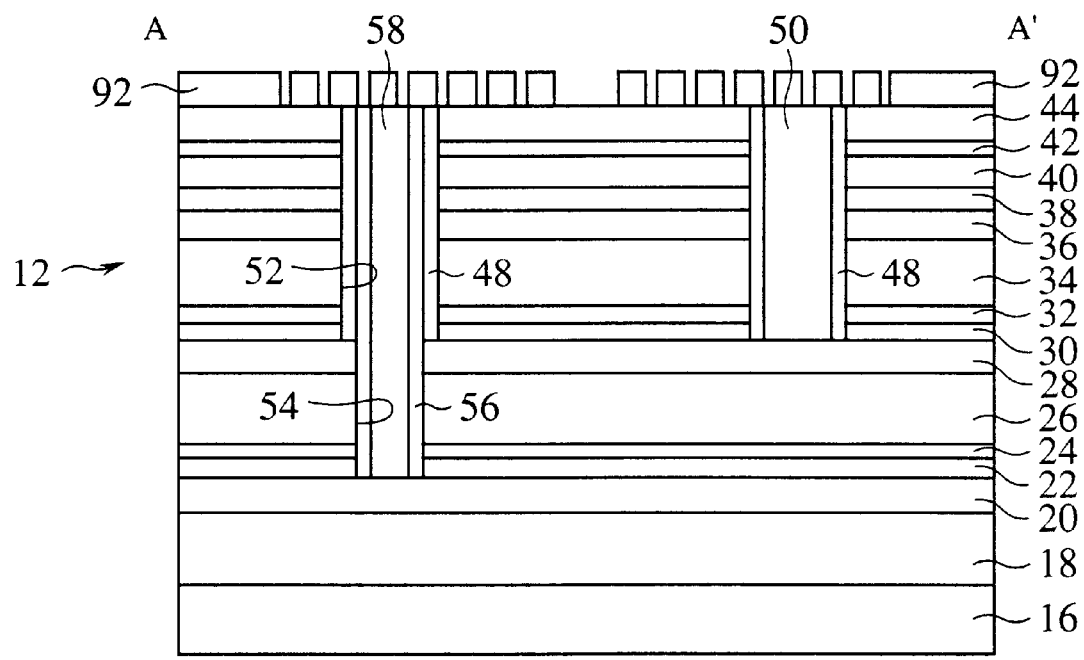
Figure 10A:
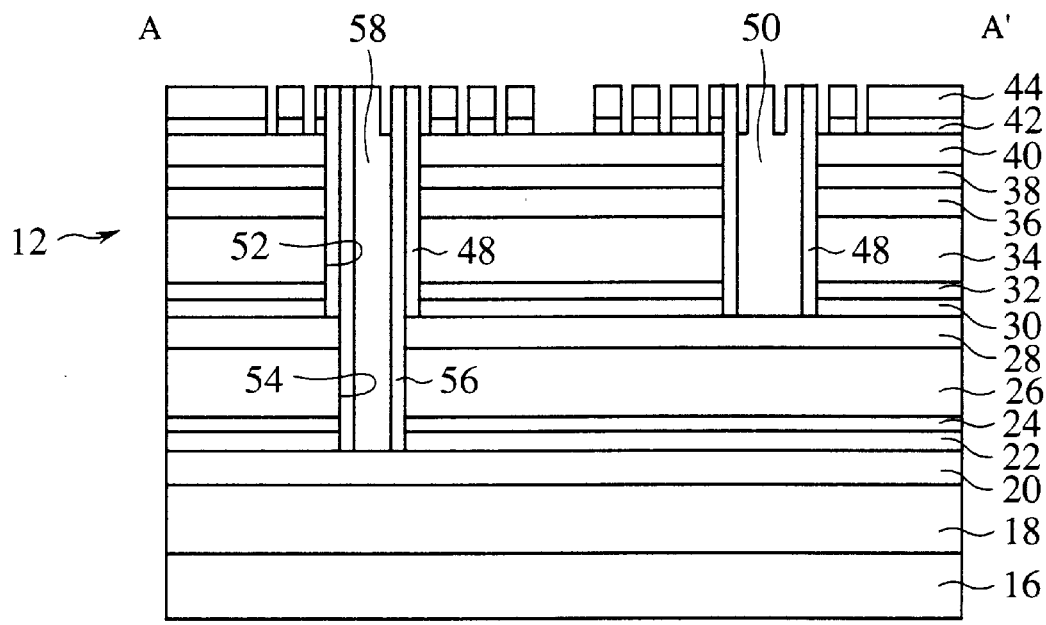
FIGS. 10A and 10B are sectional views of the optical semiconductor device according to the embodiment of the present invention, which show a method for fabricating the optical semiconductor device (Part 7).
Figure 10B:
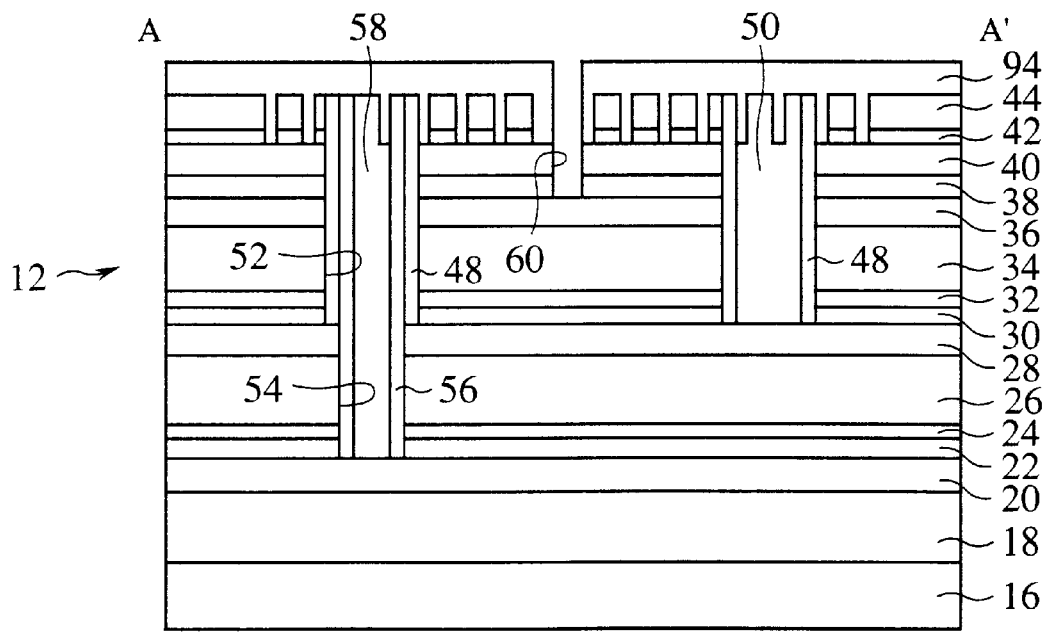

Next, the insulation film 56 on the surface is dry etched (see FIG. 9A).

Next, a photoresist film is formed on the entire surface by spin coating. Then, the photoresist film is patterned in stripes by photolithography to for a photoresist mask 92 (see FIG. 9B).

Then, with the photoresist mask 92 as a mask and with the stopper layer 42 as an etching stopper, the optical coupling layer 44 is dry etched. As an etching gas, $SiCl_4$ and $SF_6$ can be used.

Next, the stopper layer 42 is wet etched. As an etching liquid, an etching liquid, for example, mixing $NH_4OH$ and $H_2O$ can be used (see FIG. 10A). Then, the photoresist mask 92 is removed.

Next, a photoresist film is formed by spin coating. Next, a pattern for forming the contact hole 60 is opened in the photoresist film by photolithography. Thus a photoresist mask 94 is formed. Then, with the photoresist mask 94 as a mask and with the stopper layer 38 as an etching stopper, dry etching is performed. As an etching gas, $SiCl_4$ and $SF_6$ can be used.

Then, the stopper layer 38 is etched by wet etching. As an etching liquid, an etching liquid mixing $NH_4OH$ and $H_2O$, for example, can be used (see FIG. 10B). Then, the photoresist mask is removed.

Next, a photoresist film is formed by spin coating. Then, a pattern for forming the ohmic electrodes 62a, 62b, 62c is opened in the photoresist film. Thus, a photoresist mask 96 is formed (see FIG. 11A).

Figure 11A:
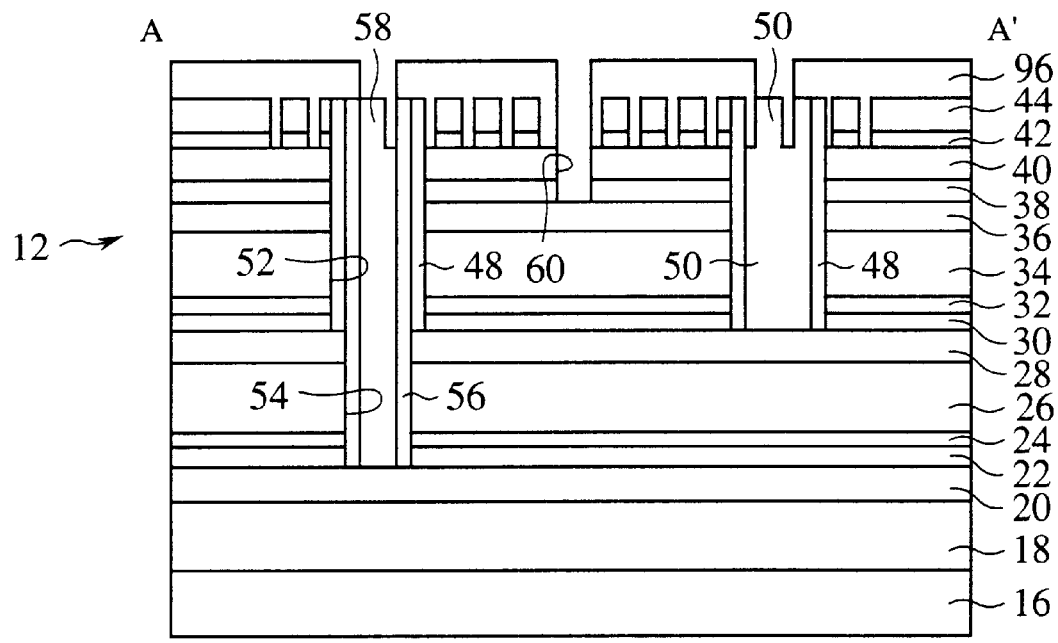
FIGS. 11A and 11B are sectional views of the optical semiconductor device according to the embodiment of the present invention, which show a method for fabricating the optical semiconductor device (Part 8).
Figure 11B:
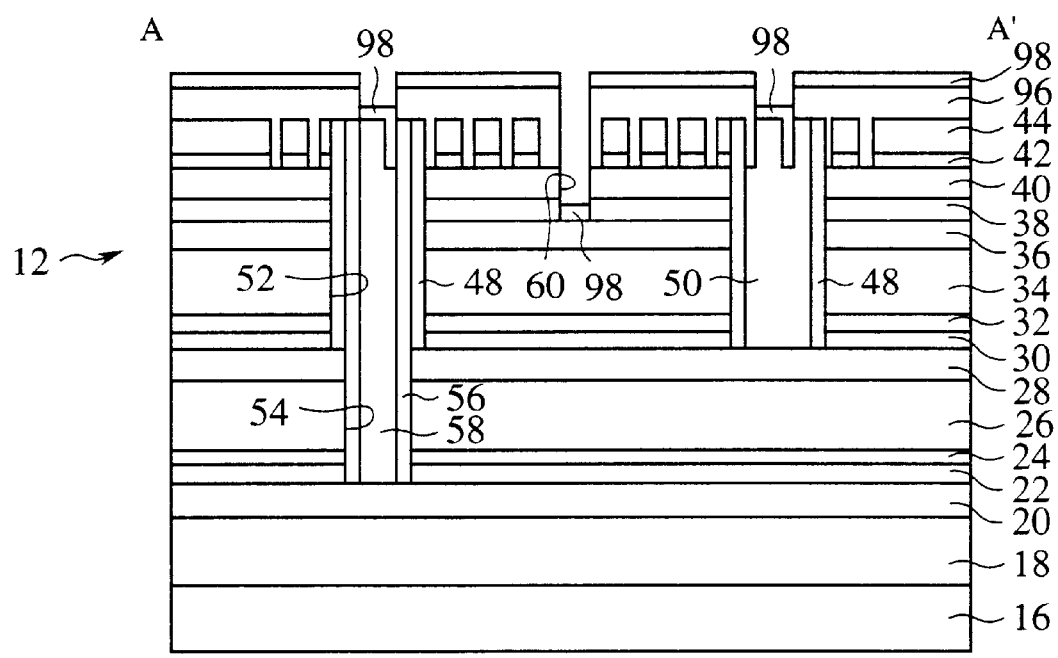
Figure 12A:
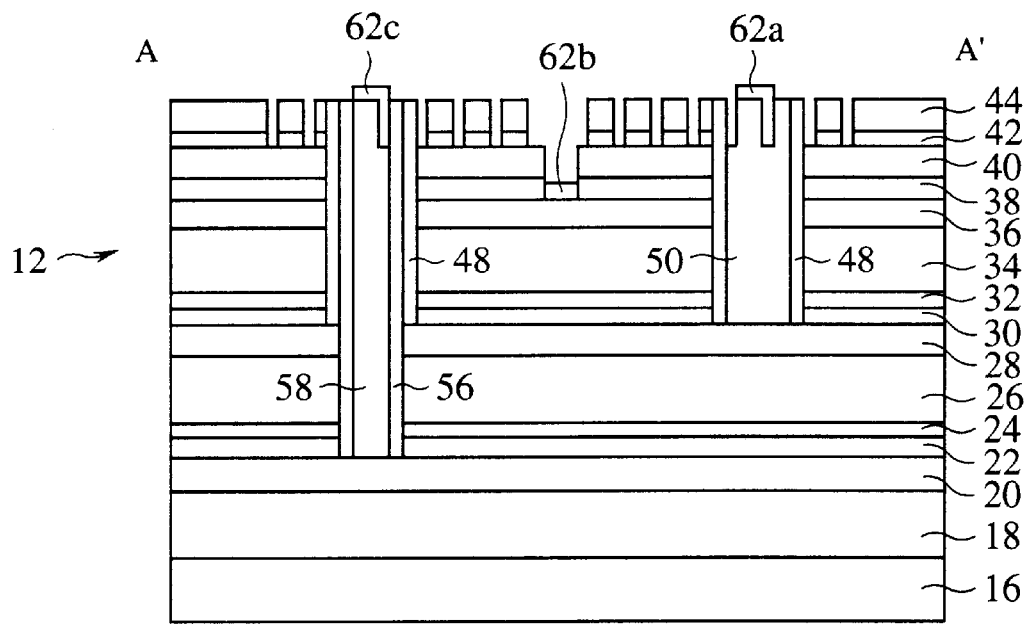
FIGS. 12A and 12B are sectional views of the optical semiconductor device according to the embodiment of the present invention, which show a method for fabricating the optical semiconductor device (Part 9).
Figure 12B:
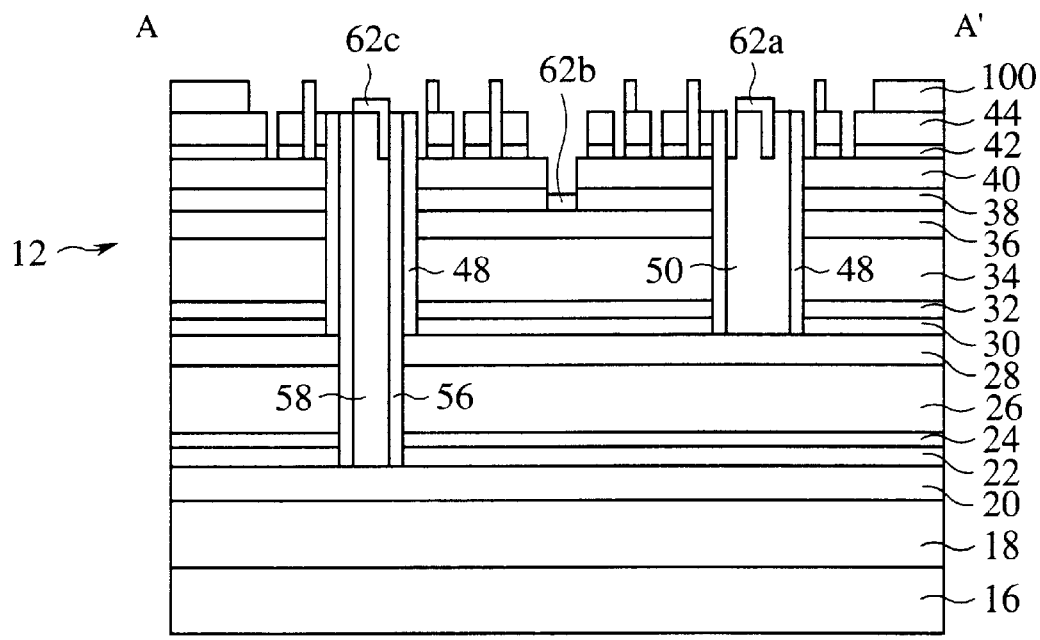

Then, with the photoresist mask 96 as a mask, a layer film 98 of an 50 nm-film thickness AuGe/Ni/Au is formed on the entire surface by vapor deposition (see FIG. 11B).

Then, lift-off is performed. Thus, the ohmic electrodes 62a, 62b, 62c of the layer film 98 are formed (see FIG. 12A).

Next, a photoresist film is formed by spin coating. Then, a pattern for forming the mirror electrode 54 is opened in the photoresist film by photolithography. Thus, a photoresist mask 100 is formed (see FIG. 12B).

Figure 13A:
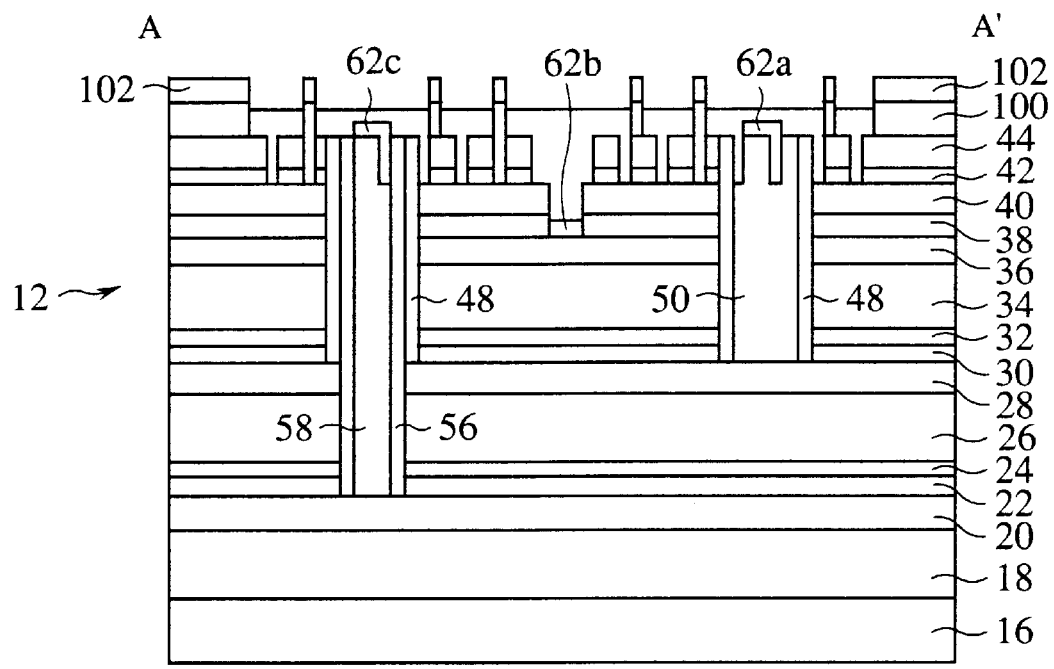
FIGS. 13A and 13B are sectional views of the optical semiconductor device according to the embodiment of the present invention, which show a method for fabricating the optical semiconductor device (Part 10).
Figure 13B:
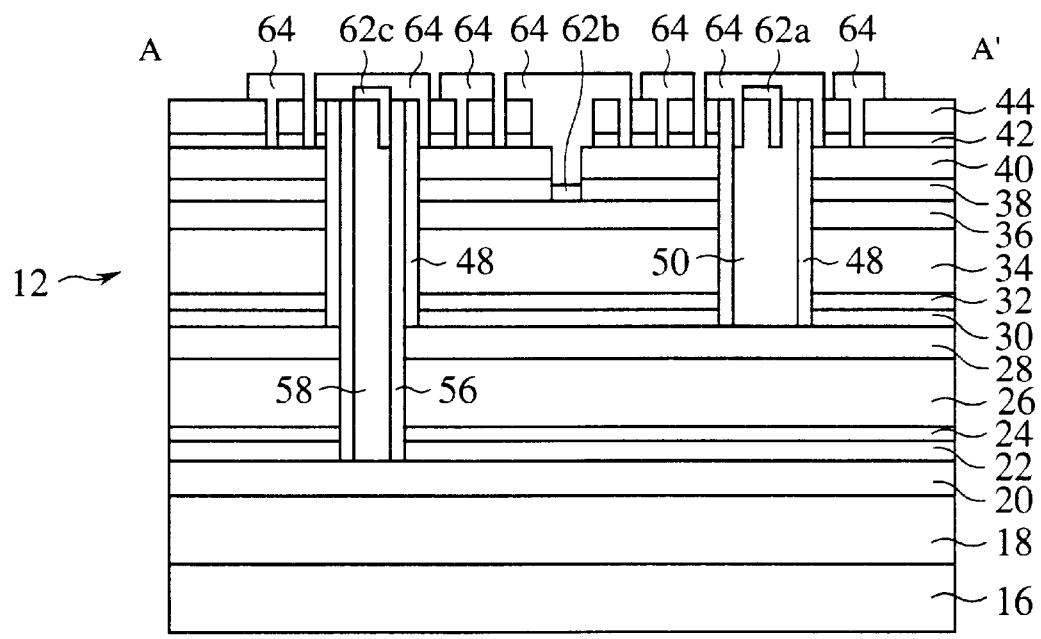
Figure 14A:
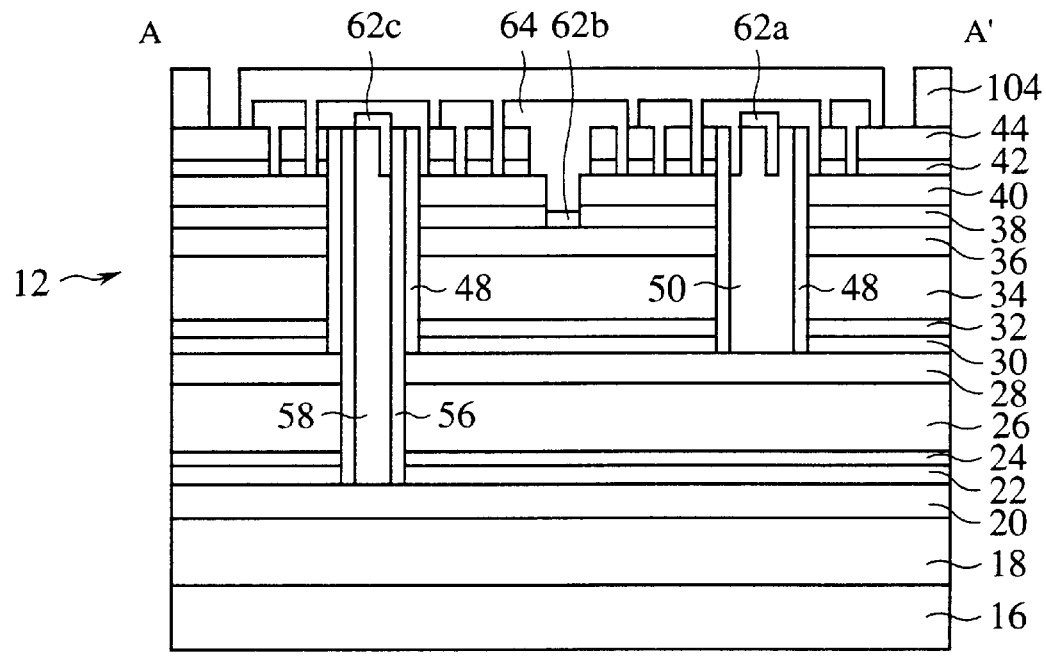
FIGS. 14A and 14B are sectional views of the optical semiconductor device according to the embodiment of the present invention, which show a method for fabricating the optical semiconductor device (Part 11).
Figure 14B:
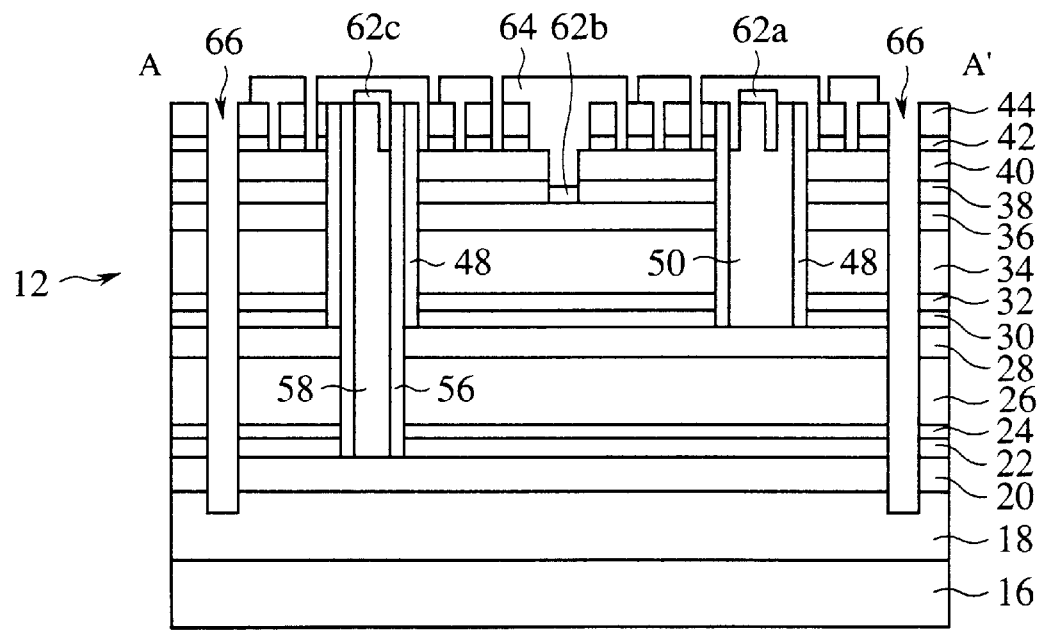
Figure 15A:
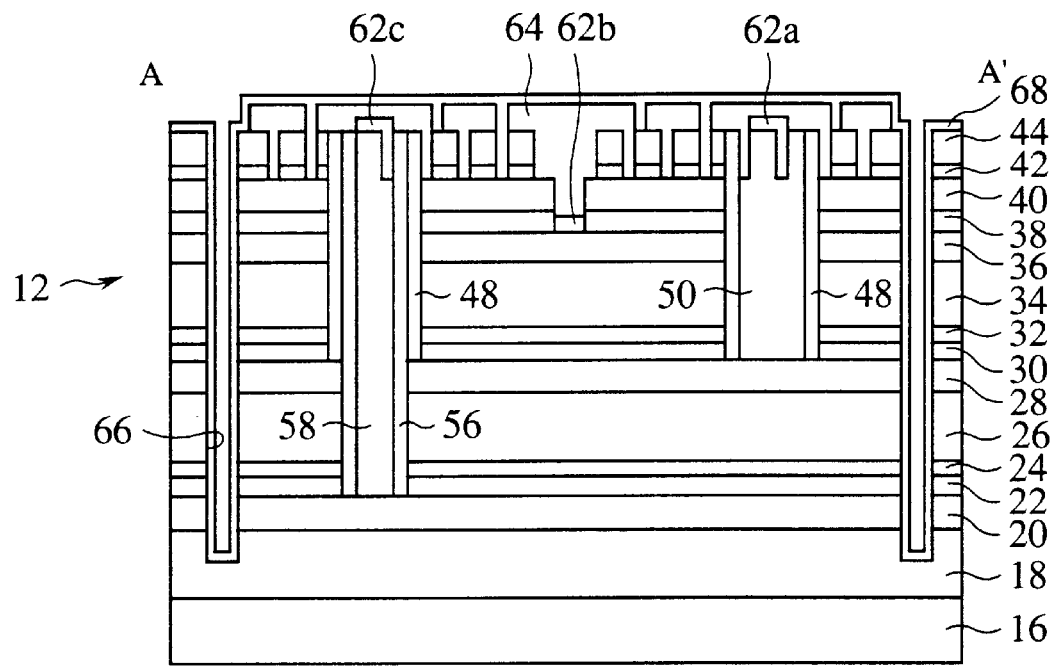
FIGS. 15A and 15B are sectional views of the optical semiconductor device according to the embodiment of the present invention, which show a method for fabricating the optical semiconductor device (Part 12).
Figure 15B:
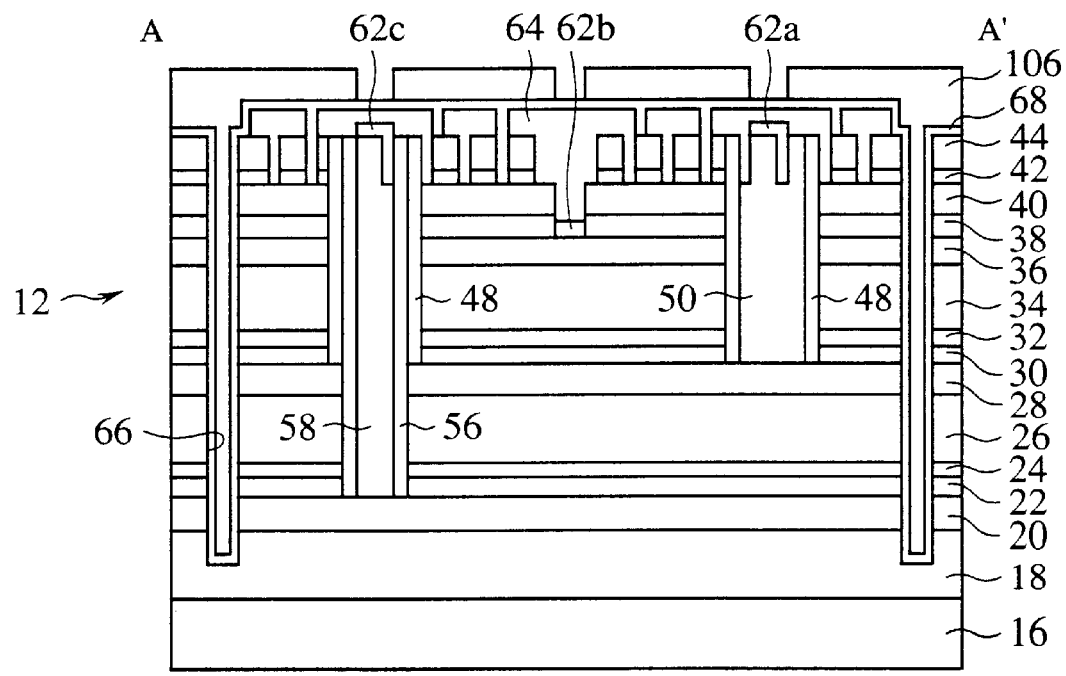
Figure 16A:
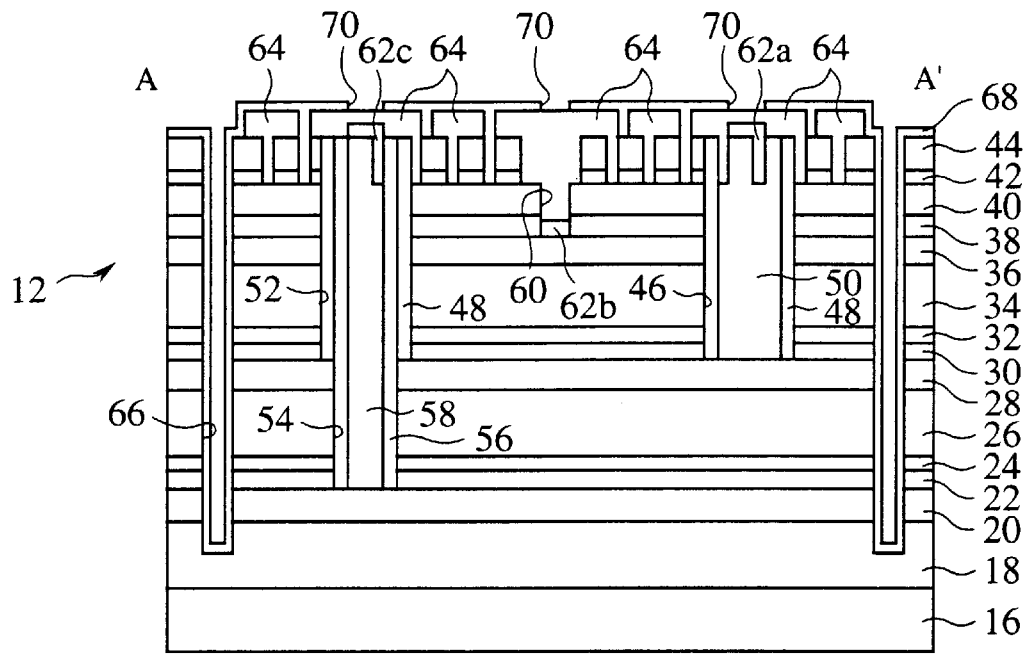
FIGS. 16A and 16B are sectional views of the optical semiconductor device according to the embodiment of the present invention, which show a method for fabricating the optical semiconductor device (Part 13).
Figure 16B:
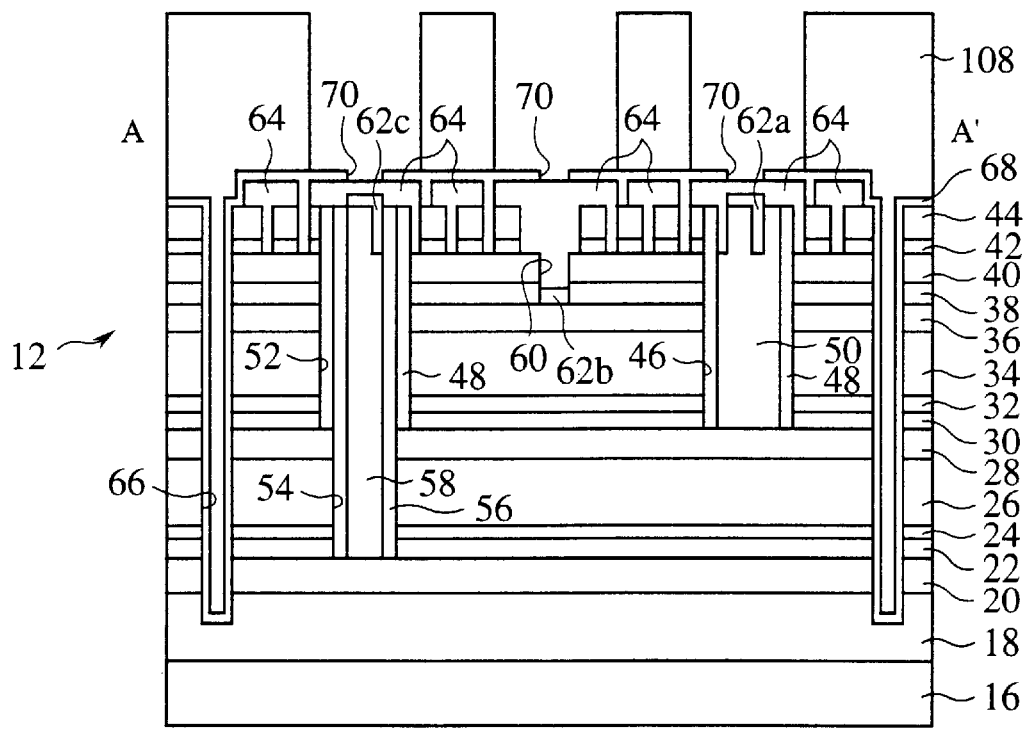
Figure 17:
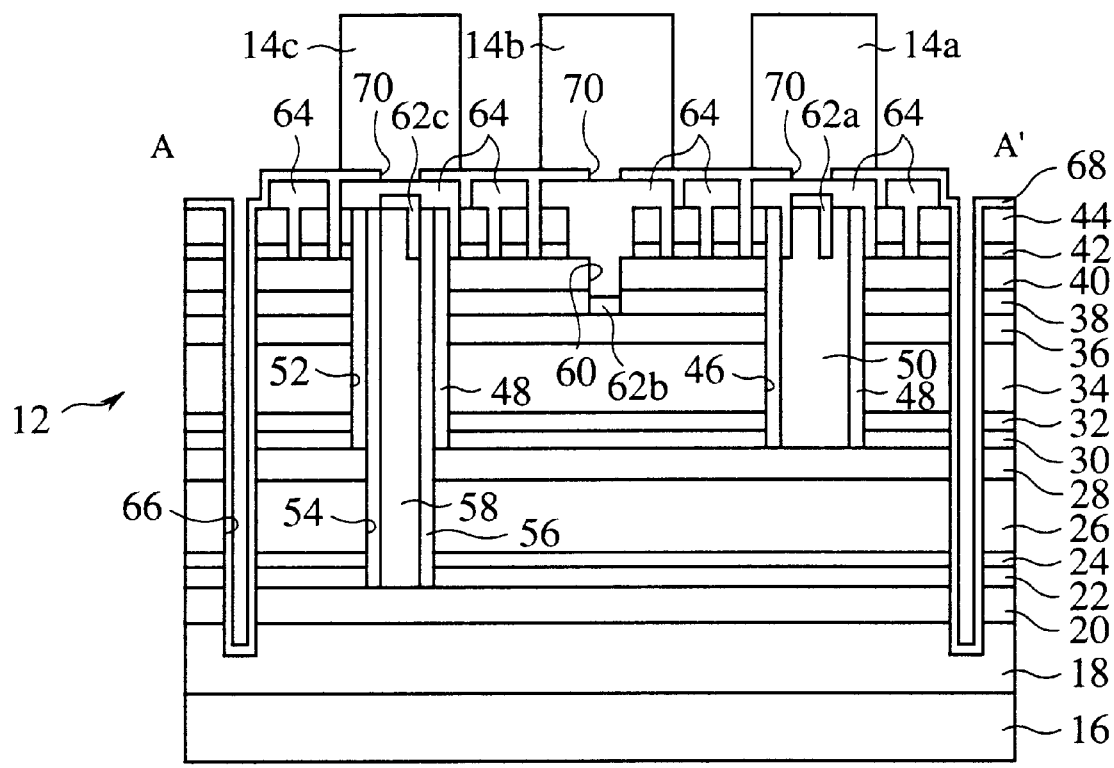
FIG. 17 is sectional view of the optical semiconductor device according to the embodiment of the present invention, which shows a method for fabricating the optical semiconductor device (Part 14).

Then, with the photoresist mask as a mask, a 200 nm-film thickness Au film, a 200 nm-film thickness Ti film and a 100 nm-film thickness Au film are sequentially laid on the entire surface by vapor deposition to form a layer film 102 of the Au/Ti/Au structure (see FIG. 13A).

Then, lift-off is performed. Thus the mirror electrode 64 of the layer film 102 is formed (see FIG. 13B).

Next, a photoresist film is formed by spin coating. Next, a pattern for forming the picture element isolation groove 66 is opened in the photoresist film by photolithography. Thus, a photoresist mask 104 is formed (see FIG. 14A).

Next, with the photoresist mask 104 as a mask and with the stopper layer 30 as an etching stopper, dry etching is performed. As an etching gas, $SiCl_4$ can be used. Thus, the picture element isolation groove 66 arriving at the stopper layer 30 is formed.

Then, with the photoresist mask 104 as a mask, the stopper film 30 is wet etched. As an etching liquid, HCl can be used.

Then, with the photoresist mask 104 as a mask and with the stopper layer 22 as an etching stopper, dry etching is performed. As an etching gas, $SiCl_4$ can be used. Thus, the picture element isolation groove 66 is formed.

Next, with the photoresist mask 104 as a mask, the stopper film 22 is wet etched. As an etching liquid, HCl can be used.

Then, with the photoresist mask 104 as a mask, wet etching is performed. As an etching liquid, an etching liquid of HF, $H_2O_2$ and $H_2O$ can be used. Thus, the picture element isolation groove 66 can be formed down to a prescribed depth from the surface of the picture element isolation insulation film 18. Then, the photoresist mask 104 is removed (see FIG. 14B).

Next, the insulation film 68 of a 500 nm-film thickness SiON film is formed on the entire face by plasma CVD. Thus, the insulation film 68 is formed also in the picture element isolation groove 66 (see FIG. 15A).

Then, a photoresist film is formed by spin coating. Next, openings are formed by photolithography in the photoresist film, corresponding to positions where the ohmic electrodes are formed. Thus, a photoresist mask 106 is formed (see FIG. 15B).

Then, with the photoresist mask 106 as a mask, the insulation film 68 is dry etched. As an etching gas, $CHF_3$ and $C_2F_6$ can be used. Thus, the contact holes 70 arriving at the mirror electrode 64 are formed corresponding to the ohmic electrodes 62a, 62b, 62c (see FIG. 16A).

Then, a photoresist film is formed by spin coating. Next, openings of shapes of the connection electrodes 14a, 14b, 14c are formed. Thus, a photoresist mask 108 is formed (see FIG. 16B).

Next, a 7 μm-film thickness Indium film is vapor deposited on the entire surface. Then, lift-off is performed. Thus, the connection electrodes 14a, 14b, 14c of the Indium film are formed (see FIG. 17).

(A Modified Embodiment)

Figure 18:
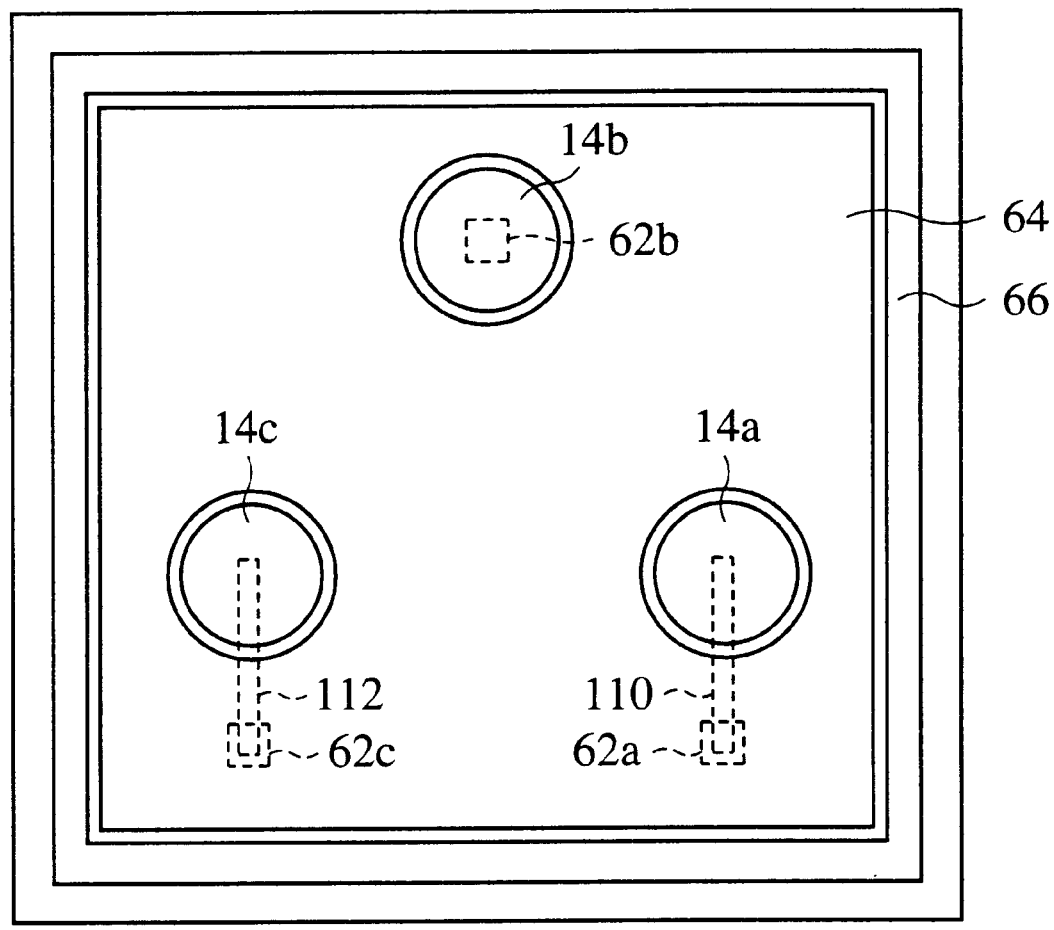
FIG. 18 is a plan view of the optical semiconductor device according to one modification of the embodiment of the present invention.

Next, the optical semiconductor device according to one modification of the embodiment will be explained with reference to FIG. 18. FIG. 18 is a plan view of the optical semiconductor device according to one modification of the embodiment.

The optical semiconductor device according to the modification is characterized in that the ohmic electrodes 62a, 62c are connected respectively to the connection electrodes 14a, 14c by lines 110, 112.

In the optical semiconductor device according to the first embodiment shown in FIGS. 1A and 1B the connection electrodes 14a, 14c are formed, positioned above the ohmic electrodes 62a, 82c. In the present modification, however, the connection electrodes 14a, 14c can be formed, spaced from the ohmic electrodes 62a, 62c.

(Modifications)

The present invention is not limited to the above-described embodiment and covers various modifications.

For example, in the above-described embodiment of the present invention is explained by means of an optical semiconductor device including two MQW layers, but the present invention is applicable to optical semiconductor devices including a plurality of MQW layers.

In the above-described embodiment, the present invention is explained by means of an optical semiconductor device which is reactive to infrared radiation, but is applicable to optical semiconductor devices which are reactive to radiation of all wavelengths.

As described above, according to the present invention, the contact layers and the connection electrodes are connected to each other respectively by the conductor plugs. The conductor plugs have such small sectional areas that the MQW layers can secure sufficiently large areas. Accordingly, high sensitivity can be provided.

As described above, according to the present invention, upper portions of the conductor plugs are also etched in stripes, and can function as an optical coupler, whereby radiation can be scattered, with a result of increased sensitivity.

As described above, according to the present invention, the conductor plugs are buried in the contact holes, whereby the connection electrodes can be formed on the conductor plugs. Accordingly, higher freedom of design can be obtained in arranging the connection electrodes.

What is claimed is:

1. An optical semiconductor device comprising:
    a first contact layer formed above a substrate;
    a first quantum well layer formed on the first contact layer;
    a second contact layer formed on the first quantum well layer;
    an optical coupling layer formed on the second contact layer; and
    a first conductor plug extending from an upper surface of the optical coupling layer, and arriving at the first contact layer through the second contact layer and the first quantum well layer.

2. An optical semiconductor device according to claim 1, further comprising:
    a third contact layer formed on the substrate and below the first contact layer;
    a second quantum well layer having light absorbing characteristics different from those of the first quantum well layer, and formed on the third contact layer and below the first contact layer; and
    a second conductor plug extending from an upper surface of the optical coupling layer and arriving at the third contact layer.

3. An optical semiconductor device according to claim 1, wherein the optical coupling layer is formed also on the first conductor plug.

4. An optical semiconductor device according to claim 2, wherein
    the optical coupling layer is formed also on the first conductor plug and the second conductor plug.

5. An optical semiconductor device according to claim 1, further comprising:
    a first connection electrode shaped like a pillar being electrically connected to the first conductor plug; and
    a second connection electrode shaped like a pillar being electrically connected to the second contact layer.

6. An optical semiconductor device according to claim 2, further comprising:
    a first connection electrode shaped like a pillar being electrically connected to the first conductor plug;
    a second connection electrode shaped like a pillar being electrically connected to the second contact layer; and
    a third connection electrode shaped like a pillar being electrically connected to the second conductor plug.

7. An optical semiconductor device according to claim 1, further comprising:
    a reflection layer formed on the upper surface of the optical coupling layer, and reflecting light incident on the side of the substrate.

8. An optical semiconductor device according to claim 7, wherein
    the reflection layer is formed also on upper surface of the first conductor plug.

9. An optical semiconductor device according to claim 2, further comprising:
    a reflection layer formed on the upper surface of the optical coupling layer, and reflecting light incident on the side of the substrate.

10. An optical semiconductor device according to claim 9, wherein
    the reflection layer is formed also on upper surface of the first conductor plug and the second conductor plug.

11. An optical semiconductor device comprising:
    a first contact layer formed above a substrate;
    a first quantum well layer formed on the first contact layer;
    a second contact layer formed on the first quantum well layer;
    an optical coupling layer formed on the second contact layer;
    a first conductor plug extending from an upper surface of the optical coupling layer, and arriving at the first contact layer through the second contact layer and the first quantum well layer, further comprising:
        a third contact layer formed on the substrate and below the first contact layer;
        a second quantum well layer having light absorbing characteristics different from those of the first quantum well layer, and formed on the third contact layer and below the first contact layer; and
        a second conductor plug extending from an upper surface of the optical coupling layer and arriving at the third contact layer.

12. An optical semiconductor device comprising:
    a first contact layer formed above a substrate;
    a first quantum well layer formed on the first contact layer;
    a second contact layer formed on the first quantum well layer;
    an optical coupling layer formed on the second contact layer; and
    a first conductor plug extending from an upper surface of the optical coupling layer, and arriving at the first contact layer through the second contact layer and the first quantum well layer, wherein the optical coupling layer is formed also on the first conductor plug.

13. An optical semiconductor device comprising:

a first contact layer formed above a substrate;

a first quantum well layer formed on the first contact layer;

a second contact layer formed on the first quantum well layer;

an optical coupling layer formed on the second contact layer; and a first conductor plug extending from an upper surface of the optical coupling layer, and arriving at the first contact layer through the second contact layer and the first quantum well layer, further comprising a reflection layer formed on the upper surface of the optical coupling layer, and reflecting light incident on the side of the substrate.

* * * * *